(12) United States Patent
Ayyapureddi et al.

(10) Patent No.: US 11,568,918 B2
(45) Date of Patent: *Jan. 31, 2023

(54) APPARATUSES, SYSTEMS, AND METHODS FOR ANALOG ACCUMULATOR FOR DETERMINING ROW ACCESS RATE AND TARGET ROW ADDRESS USED FOR REFRESH OPERATION

(71) Applicant: MICRON TECHNOLOGY, INC., Boise, ID (US)

(72) Inventors: Sujeet Ayyapureddi, Boise, ID (US); Raghukiran Sreeramaneni, Hyderabad (IN)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 17/170,616

(22) Filed: Feb. 8, 2021

(65) Prior Publication Data

US 2021/0158851 A1 May 27, 2021

Related U.S. Application Data

(62) Division of application No. 16/548,027, filed on Aug. 22, 2019, now Pat. No. 10,964,378.

(51) Int. Cl.
*G11C 11/408* (2006.01)
*G11C 11/406* (2006.01)
(Continued)

(52) U.S. Cl.
CPC ........ *G11C 11/408* (2013.01); *G11C 11/1655* (2013.01); *G11C 11/1657* (2013.01);
(Continued)

(58) Field of Classification Search
CPC .............. G11C 11/408; G11C 11/1655; G11C 11/1657; G11C 11/406; G11C 15/043
See application file for complete search history.

(56) References Cited

U.S. PATENT DOCUMENTS

| 1,158,364 A | 10/1915 | Bibb |
| 3,633,175 A | 1/1972 | Harper |

(Continued)

FOREIGN PATENT DOCUMENTS

| CN | 1144434 A | 3/1997 |
| CN | 1195173 A | 10/1998 |

(Continued)

OTHER PUBLICATIONS

US 11,264,075 B2, 03/2022, Bell et al. (withdrawn)

(Continued)

*Primary Examiner* — Mushfique Siddique
(74) *Attorney, Agent, or Firm* — Dorsey & Whitney LLP

(57) ABSTRACT

Embodiments of the disclosure are drawn to apparatuses, systems, and methods for analog row access rate determination. Accesses to different row addresses may be tracked by storing one or more received addresses in a slice of stack. Each slice includes an accumulator circuit which provides a voltage based on charge on a capacitor. When a row address is received, it may be compared to the row addresses stored in the stack, and if there is a match, the charge on the capacitor in the associated accumulator circuit is increased. Each slice may also include a voltage to time (VtoT) circuit which may be used to identify the highest of the voltages provided by the accumulator circuits. The row address stored in the slide with the highest voltage may be refreshed.

20 Claims, 8 Drawing Sheets

(51) Int. Cl.
   *G11C 15/04* (2006.01)
   *G11C 11/16* (2006.01)
   *G11C 11/4074* (2006.01)

(52) U.S. Cl.
   CPC ........ *G11C 11/406* (2013.01); *G11C 11/4074* (2013.01); *G11C 15/043* (2013.01)

(56) References Cited

U.S. PATENT DOCUMENTS

| | | |
|---|---|---|
| 5,291,198 A | 3/1994 | Dingwall et al. |
| 5,299,159 A | 3/1994 | Balistreri et al. |
| 5,422,850 A | 6/1995 | Sukegawa et al. |
| 5,638,317 A | 6/1997 | Tran |
| 5,699,297 A | 12/1997 | Yamazaki et al. |
| 5,768,196 A | 6/1998 | Bloker et al. |
| 5,933,377 A | 8/1999 | Hidaka |
| 5,943,283 A | 8/1999 | Wong et al. |
| 5,970,507 A | 10/1999 | Kato et al. |
| 5,999,471 A | 12/1999 | Choi |
| 6,002,629 A | 12/1999 | Kim et al. |
| 6,011,734 A | 1/2000 | Pappert |
| 6,061,290 A | 5/2000 | Shirley |
| 6,212,118 B1 | 4/2001 | Fujita |
| 6,310,806 B1 | 10/2001 | Higashi et al. |
| 6,317,381 B1 | 11/2001 | Gans et al. |
| 6,373,738 B1 | 4/2002 | Towler et al. |
| 6,392,952 B1 | 5/2002 | Chen et al. |
| 6,424,582 B1 | 7/2002 | Ooishi |
| 6,434,064 B2 | 8/2002 | Nagai |
| 6,452,868 B1 | 9/2002 | Fister |
| 6,480,931 B1 | 11/2002 | Buti et al. |
| 6,567,340 B1 | 5/2003 | Nataraj et al. |
| 6,950,364 B2 | 9/2005 | Kim |
| 7,027,343 B2 | 4/2006 | Sinha et al. |
| 7,057,960 B1 | 6/2006 | Fiscus et al. |
| 7,082,070 B2 | 7/2006 | Hong |
| 7,187,607 B2 | 3/2007 | Koshikawa et al. |
| 7,203,113 B2 | 4/2007 | Takahashi et al. |
| 7,203,115 B2 | 4/2007 | Eto et al. |
| 7,209,402 B2 | 4/2007 | Shinozaki et al. |
| 7,215,588 B2 | 5/2007 | Lee |
| 7,283,380 B1 | 10/2007 | Srinivasan et al. |
| 7,304,875 B1 * | 12/2007 | Lien ................ G11C 15/00 365/49.1 |
| 7,319,602 B1 | 1/2008 | Srinivasan et al. |
| 7,444,577 B2 | 10/2008 | Best et al. |
| 7,551,502 B2 | 6/2009 | Dono et al. |
| 7,565,479 B2 | 7/2009 | Best et al. |
| 7,830,742 B2 | 11/2010 | Han |
| 7,870,362 B2 | 1/2011 | Hong et al. |
| 7,872,907 B2 | 1/2011 | Okayama et al. |
| 8,174,921 B2 | 5/2012 | Kim et al. |
| 8,400,805 B2 | 3/2013 | Yoko |
| 8,451,677 B2 | 5/2013 | Okahiro et al. |
| 8,625,360 B2 | 1/2014 | Iwamoto et al. |
| 8,676,725 B1 | 3/2014 | Lin et al. |
| 8,681,578 B2 | 3/2014 | Narui |
| 8,756,368 B2 | 6/2014 | Best et al. |
| 8,811,100 B2 | 8/2014 | Ku |
| 8,862,973 B2 | 10/2014 | Zimmerman et al. |
| 8,938,573 B2 | 1/2015 | Greenfield et al. |
| 9,032,141 B2 | 5/2015 | Bains et al. |
| 9,047,978 B2 | 6/2015 | Bell et al. |
| 9,058,900 B2 | 6/2015 | Kang |
| 9,087,554 B1 | 7/2015 | Park |
| 9,087,602 B2 | 7/2015 | Youn et al. |
| 9,117,544 B2 | 8/2015 | Bains et al. |
| 9,123,447 B2 | 9/2015 | Lee et al. |
| 9,153,294 B2 | 10/2015 | Kang |
| 9,190,137 B2 | 11/2015 | Kim et al. |
| 9,190,139 B2 | 11/2015 | Jung et al. |
| 9,251,885 B2 | 1/2016 | Greenfield et al. |
| 9,286,964 B2 | 3/2016 | Halbert et al. |
| 9,299,457 B2 | 3/2016 | Chun et al. |
| 9,311,985 B2 | 4/2016 | Lee et al. |
| 9,324,398 B2 | 4/2016 | Jones et al. |
| 9,384,821 B2 | 7/2016 | Bains et al. |
| 9,390,782 B2 | 7/2016 | Best et al. |
| 9,412,432 B2 | 8/2016 | Narui et al. |
| 9,424,907 B2 | 8/2016 | Fujishiro |
| 9,484,079 B2 | 11/2016 | Lee |
| 9,514,850 B2 | 12/2016 | Kim |
| 9,570,143 B2 | 2/2017 | Lim et al. |
| 9,646,672 B1 | 5/2017 | Kim et al. |
| 9,672,889 B2 | 6/2017 | Lee et al. |
| 9,685,240 B1 | 6/2017 | Park |
| 9,691,466 B1 | 6/2017 | Kim |
| 9,697,913 B1 | 7/2017 | Mariani et al. |
| 9,734,887 B1 | 8/2017 | Tavva |
| 9,741,409 B2 | 8/2017 | Jones et al. |
| 9,741,447 B2 | 8/2017 | Akamatsu |
| 9,747,971 B2 | 8/2017 | Bains et al. |
| 9,761,297 B1 | 9/2017 | Tomishima |
| 9,786,351 B2 | 10/2017 | Lee et al. |
| 9,799,391 B1 | 10/2017 | Wei |
| 9,805,782 B1 | 10/2017 | Liou |
| 9,805,783 B2 | 10/2017 | Ito et al. |
| 9,818,469 B1 | 11/2017 | Kim et al. |
| 9,847,118 B1 | 12/2017 | Won |
| 9,865,326 B2 | 1/2018 | Bains et al. |
| 9,865,328 B1 | 1/2018 | Desimone et al. |
| 9,922,694 B2 | 3/2018 | Akamatsu |
| 9,934,143 B2 | 4/2018 | Bains et al. |
| 9,953,696 B2 | 4/2018 | Kim |
| 10,032,501 B2 | 7/2018 | Ito et al. |
| 10,083,737 B2 | 9/2018 | Bains et al. |
| 10,090,038 B2 | 10/2018 | Shin |
| 10,134,461 B2 | 11/2018 | Bell et al. |
| 10,147,472 B2 | 12/2018 | Jones et al. |
| 10,153,031 B2 | 12/2018 | Akamatsu |
| 10,170,174 B1 | 1/2019 | Ito et al. |
| 10,176,860 B1 | 1/2019 | Mylavarapu |
| 10,210,925 B2 | 2/2019 | Bains et al. |
| 10,297,305 B1 | 5/2019 | Moon et al. |
| 10,339,994 B2 | 7/2019 | Ito et al. |
| 10,381,327 B2 | 8/2019 | Ramachandra et al. |
| 10,387,276 B2 | 8/2019 | Ryu et al. |
| 10,446,216 B2 | 10/2019 | Oh et al. |
| 10,490,251 B2 | 11/2019 | Wolff |
| 10,600,462 B2 | 3/2020 | Augustine et al. |
| 10,600,491 B2 | 3/2020 | Chou et al. |
| 10,607,686 B2 | 3/2020 | Akamatsu |
| 10,629,286 B2 | 4/2020 | Lee et al. |
| 10,679,710 B2 | 6/2020 | Hirashima et al. |
| 10,705,900 B2 | 7/2020 | Jin |
| 10,770,127 B2 | 9/2020 | Shore et al. |
| 10,811,066 B2 | 10/2020 | Jones et al. |
| 10,832,792 B1 * | 11/2020 | Penney ................ G11C 29/783 |
| 10,861,519 B2 | 12/2020 | Jones et al. |
| 10,867,660 B2 | 12/2020 | Akamatsu |
| 10,930,335 B2 | 2/2021 | Bell et al. |
| 10,943,636 B1 | 3/2021 | Wu et al. |
| 10,950,289 B2 | 3/2021 | Ito et al. |
| 10,964,378 B2 * | 3/2021 | Ayyapureddi ...... G11C 11/1657 |
| 11,011,215 B1 | 5/2021 | Parry et al. |
| 11,043,254 B2 | 6/2021 | Enomoto et al. |
| 11,139,015 B2 | 10/2021 | Brown et al. |
| 11,152,050 B2 | 10/2021 | Morohashi et al. |
| 11,158,364 B2 | 10/2021 | Penney et al. |
| 11,158,373 B2 | 10/2021 | Penney et al. |
| 11,200,942 B2 | 12/2021 | Jenkinson et al. |
| 11,222,682 B1 | 1/2022 | Enomoto et al. |
| 11,257,535 B2 | 2/2022 | Shore et al. |
| 11,264,096 B2 | 3/2022 | Schreck et al. |
| 11,322,192 B2 | 5/2022 | Morohashi et al. |
| 11,361,808 B2 | 6/2022 | Bell et al. |
| 2001/0008498 A1 | 7/2001 | Ooishi |
| 2002/0007476 A1 | 1/2002 | Kishino |
| 2002/0078311 A1 | 6/2002 | Matsuzaki et al. |
| 2002/0080677 A1 | 6/2002 | Watanabe et al. |
| 2002/0181301 A1 | 12/2002 | Takahashi et al. |
| 2003/0063512 A1 | 4/2003 | Takahashi et al. |
| 2003/0067825 A1 | 4/2003 | Shimano et al. |
| 2003/0090400 A1 | 5/2003 | Barker |

(56) References Cited

U.S. PATENT DOCUMENTS

| | | |
|---|---|---|
| 2003/0123301 A1 | 7/2003 | Jang et al. |
| 2003/0193829 A1 | 10/2003 | Morgan et al. |
| 2003/0231540 A1 | 12/2003 | Lazar et al. |
| 2004/0004856 A1 | 1/2004 | Sakimura et al. |
| 2004/0008544 A1 | 1/2004 | Shinozaki et al. |
| 2004/0022093 A1 | 2/2004 | Lee |
| 2004/0052142 A1 | 3/2004 | Ikehashi et al. |
| 2004/0114446 A1 | 6/2004 | Takahashi et al. |
| 2004/0130959 A1 | 7/2004 | Kawaguchi |
| 2004/0174757 A1 | 9/2004 | Garverick et al. |
| 2004/0184323 A1 | 9/2004 | Mori et al. |
| 2004/0213035 A1 | 10/2004 | Cavaleri et al. |
| 2004/0218431 A1 | 11/2004 | Chung et al. |
| 2005/0041502 A1 | 2/2005 | Perner |
| 2005/0105315 A1 | 5/2005 | Shin et al. |
| 2005/0243629 A1 | 11/2005 | Lee |
| 2005/0265104 A1 | 12/2005 | Remaklus et al. |
| 2006/0083099 A1 | 4/2006 | Bae et al. |
| 2006/0087903 A1 | 4/2006 | Riho et al. |
| 2006/0176744 A1 | 8/2006 | Stave |
| 2006/0262616 A1 | 11/2006 | Chen |
| 2007/0008799 A1 | 1/2007 | Done et al. |
| 2007/0014174 A1 | 1/2007 | Ohsawa |
| 2007/0028068 A1 | 2/2007 | Golding et al. |
| 2007/0030746 A1 | 2/2007 | Best et al. |
| 2007/0033339 A1 | 2/2007 | Best et al. |
| 2007/0133330 A1 | 6/2007 | Ohsawa |
| 2007/0230264 A1 | 10/2007 | Eto |
| 2007/0237016 A1 | 10/2007 | Miyamoto et al. |
| 2007/0297252 A1 | 12/2007 | Singh |
| 2008/0028260 A1 | 1/2008 | Oyagi et al. |
| 2008/0031068 A1 | 2/2008 | Yoo et al. |
| 2008/0062742 A1 | 3/2008 | Wang |
| 2008/0126893 A1 | 5/2008 | Harrand et al. |
| 2008/0130394 A1 | 6/2008 | Done et al. |
| 2008/0181048 A1 | 7/2008 | Han |
| 2008/0224742 A1 | 9/2008 | Pomichter |
| 2008/0253212 A1 | 10/2008 | Iida et al. |
| 2008/0266990 A1 | 10/2008 | Loeffler |
| 2008/0288720 A1 | 11/2008 | Atwal et al. |
| 2008/0301362 A1* | 12/2008 | Cavanna .................. G06F 7/74 711/108 |
| 2008/0313494 A1 | 12/2008 | Hummler et al. |
| 2008/0316845 A1 | 12/2008 | Wang et al. |
| 2009/0021999 A1 | 1/2009 | Tanimura et al. |
| 2009/0059641 A1 | 3/2009 | Jeddeloh |
| 2009/0077571 A1 | 3/2009 | Gara et al. |
| 2009/0161457 A1 | 6/2009 | Wakimoto |
| 2009/0168571 A1 | 7/2009 | Pyo et al. |
| 2009/0185440 A1 | 7/2009 | Lee |
| 2009/0201752 A1 | 8/2009 | Riho et al. |
| 2009/0213675 A1 | 8/2009 | Shino |
| 2009/0251971 A1 | 10/2009 | Futatsuyama |
| 2009/0296510 A1 | 12/2009 | Lee et al. |
| 2010/0005217 A1 | 1/2010 | Jeddeloh |
| 2010/0005376 A1 | 1/2010 | Laberge et al. |
| 2010/0054011 A1 | 3/2010 | Kim |
| 2010/0074042 A1 | 3/2010 | Fukuda et al. |
| 2010/0080074 A1 | 4/2010 | Ohmaru et al. |
| 2010/0110809 A1 | 5/2010 | Kobayashi et al. |
| 2010/0110810 A1 | 5/2010 | Kobayashi |
| 2010/0131812 A1 | 5/2010 | Mohammad |
| 2010/0157693 A1 | 6/2010 | Iwai et al. |
| 2010/0182863 A1 | 7/2010 | Fukiage |
| 2010/0329069 A1 | 12/2010 | Ito et al. |
| 2011/0026290 A1 | 2/2011 | Noda et al. |
| 2011/0051530 A1 | 3/2011 | Kushida |
| 2011/0055495 A1 | 3/2011 | Remaklus, Jr. et al. |
| 2011/0069572 A1 | 3/2011 | Lee et al. |
| 2011/0122987 A1 | 5/2011 | Neyer |
| 2011/0216614 A1 | 9/2011 | Hosoe |
| 2011/0225355 A1 | 9/2011 | Kajigaya |
| 2011/0286271 A1 | 11/2011 | Chen |
| 2011/0310648 A1 | 12/2011 | Iwamoto et al. |
| 2011/0317462 A1* | 12/2011 | Gyllenhammer ...... G11C 15/04 365/49.17 |
| 2012/0014199 A1 | 1/2012 | Narui |
| 2012/0059984 A1 | 3/2012 | Kang et al. |
| 2012/0151131 A1 | 6/2012 | Kilmer et al. |
| 2012/0213021 A1 | 8/2012 | Riho et al. |
| 2012/0254472 A1 | 10/2012 | Ware et al. |
| 2013/0003467 A1 | 1/2013 | Klein |
| 2013/0003477 A1 | 1/2013 | Park et al. |
| 2013/0057173 A1 | 3/2013 | Yao et al. |
| 2013/0107623 A1 | 5/2013 | Kavalipurapu et al. |
| 2013/0173971 A1 | 7/2013 | Zimmerman |
| 2013/0254475 A1 | 9/2013 | Perego et al. |
| 2013/0279284 A1 | 10/2013 | Jeong |
| 2013/0304982 A1 | 11/2013 | Jung et al. |
| 2014/0006703 A1 | 1/2014 | Bains et al. |
| 2014/0006704 A1 | 1/2014 | Greenfield et al. |
| 2014/0013169 A1 | 1/2014 | Kobla et al. |
| 2014/0013185 A1 | 1/2014 | Kobla et al. |
| 2014/0050004 A1 | 2/2014 | Mochida |
| 2014/0078841 A1 | 3/2014 | Chopra |
| 2014/0078842 A1 | 3/2014 | Oh et al. |
| 2014/0078845 A1 | 3/2014 | Song |
| 2014/0089576 A1 | 3/2014 | Bains et al. |
| 2014/0095780 A1 | 4/2014 | Bains et al. |
| 2014/0095786 A1 | 4/2014 | Moon et al. |
| 2014/0119091 A1 | 5/2014 | You et al. |
| 2014/0136763 A1 | 5/2014 | Li et al. |
| 2014/0143473 A1 | 5/2014 | Kim et al. |
| 2014/0177370 A1 | 6/2014 | Halbert et al. |
| 2014/0177376 A1 | 6/2014 | Song |
| 2014/0189215 A1 | 7/2014 | Kang et al. |
| 2014/0189228 A1 | 7/2014 | Greenfield et al. |
| 2014/0219043 A1 | 8/2014 | Jones et al. |
| 2014/0237307 A1 | 8/2014 | Kobla et al. |
| 2014/0241099 A1 | 8/2014 | Seo et al. |
| 2014/0254298 A1 | 9/2014 | Dally |
| 2014/0269021 A1 | 9/2014 | Yang et al. |
| 2014/0281206 A1 | 9/2014 | Crawford et al. |
| 2014/0281207 A1 | 9/2014 | Mandava et al. |
| 2014/0292375 A1 | 10/2014 | Angelini et al. |
| 2014/0293725 A1 | 10/2014 | Best et al. |
| 2014/0317344 A1 | 10/2014 | Kim |
| 2014/0355332 A1 | 12/2014 | Youn et al. |
| 2014/0369109 A1 | 12/2014 | Lee et al. |
| 2014/0379978 A1 | 12/2014 | Kim et al. |
| 2015/0049567 A1 | 2/2015 | Chi |
| 2015/0055420 A1 | 2/2015 | Bell et al. |
| 2015/0078112 A1 | 3/2015 | Huang |
| 2015/0089326 A1 | 3/2015 | Joo et al. |
| 2015/0155027 A1 | 6/2015 | Abe et al. |
| 2015/0162067 A1 | 6/2015 | Kim et al. |
| 2015/0170728 A1 | 6/2015 | Jung et al. |
| 2015/0199126 A1 | 7/2015 | Jayasena et al. |
| 2015/0206572 A1 | 7/2015 | Lim et al. |
| 2015/0213872 A1 | 7/2015 | Mazumder et al. |
| 2015/0213877 A1 | 7/2015 | Darel |
| 2015/0228341 A1 | 8/2015 | Watanabe et al. |
| 2015/0243339 A1 | 8/2015 | Bell et al. |
| 2015/0255140 A1 | 9/2015 | Song |
| 2015/0262652 A1 | 9/2015 | Igarashi |
| 2015/0279441 A1 | 10/2015 | Greenberg et al. |
| 2015/0279442 A1 | 10/2015 | Hwang |
| 2015/0294711 A1 | 10/2015 | Gaither et al. |
| 2015/0340077 A1 | 11/2015 | Akamatsu |
| 2015/0356048 A1 | 12/2015 | King |
| 2016/0019940 A1 | 1/2016 | Jang et al. |
| 2016/0027498 A1 | 1/2016 | Ware et al. |
| 2016/0027531 A1 | 1/2016 | Jones et al. |
| 2016/0027532 A1 | 1/2016 | Kim |
| 2016/0042782 A1 | 2/2016 | Narui et al. |
| 2016/0078845 A1 | 3/2016 | Lin et al. |
| 2016/0078911 A1 | 3/2016 | Fujiwara et al. |
| 2016/0078918 A1 | 3/2016 | Hyun et al. |
| 2016/0086649 A1 | 3/2016 | Heng et al. |
| 2016/0086651 A1 | 3/2016 | Kim |
| 2016/0093402 A1 | 3/2016 | Kitagawa et al. |
| 2016/0099043 A1 | 4/2016 | Tu |
| 2016/0111140 A1 | 4/2016 | Joo et al. |

(56) References Cited

U.S. PATENT DOCUMENTS

| | | |
|---|---|---|
| 2016/0125931 A1 | 5/2016 | Doo et al. |
| 2016/0133314 A1 | 5/2016 | Hwang et al. |
| 2016/0140243 A1 | 5/2016 | Adams et al. |
| 2016/0163372 A1 | 6/2016 | Lee et al. |
| 2016/0172056 A1 | 6/2016 | Huh |
| 2016/0180917 A1 | 6/2016 | Chishti et al. |
| 2016/0180921 A1 | 6/2016 | Jeong |
| 2016/0196863 A1 | 7/2016 | Shin et al. |
| 2016/0202926 A1 | 7/2016 | Benedict |
| 2016/0211008 A1 | 7/2016 | Benedict et al. |
| 2016/0225433 A1 | 8/2016 | Bains et al. |
| 2016/0225461 A1 | 8/2016 | Tuers et al. |
| 2016/0336060 A1 | 11/2016 | Shin |
| 2016/0343423 A1 | 11/2016 | Shido |
| 2017/0011792 A1 | 1/2017 | Oh et al. |
| 2017/0076779 A1 | 3/2017 | Bains et al. |
| 2017/0092350 A1 | 3/2017 | Halbert et al. |
| 2017/0117030 A1 | 4/2017 | Fisch et al. |
| 2017/0133085 A1 | 5/2017 | Kim et al. |
| 2017/0139641 A1 | 5/2017 | Cha et al. |
| 2017/0140807 A1 | 5/2017 | Sun et al. |
| 2017/0140811 A1 | 5/2017 | Joo |
| 2017/0148504 A1 | 5/2017 | Saifuddin et al. |
| 2017/0177246 A1 | 6/2017 | Miller et al. |
| 2017/0186481 A1 | 6/2017 | Oh et al. |
| 2017/0213586 A1 | 7/2017 | Kang et al. |
| 2017/0221546 A1 | 8/2017 | Loh et al. |
| 2017/0263305 A1 | 9/2017 | Cho |
| 2017/0287547 A1 | 10/2017 | Ito et al. |
| 2017/0323675 A1 | 11/2017 | Janes et al. |
| 2017/0352399 A1 | 12/2017 | Yokoyama et al. |
| 2017/0371742 A1 | 12/2017 | Shim et al. |
| 2017/0372767 A1 | 12/2017 | Kang et al. |
| 2018/0005690 A1 | 1/2018 | Morgan et al. |
| 2018/0025770 A1 | 1/2018 | Ito et al. |
| 2018/0025772 A1 | 1/2018 | Lee et al. |
| 2018/0060194 A1 | 3/2018 | Ryu et al. |
| 2018/0061483 A1 | 3/2018 | Morgan |
| 2018/0082737 A1 | 3/2018 | Lee |
| 2018/0084314 A1 | 3/2018 | Koyama |
| 2018/0090199 A1 | 3/2018 | Kim et al. |
| 2018/0096719 A1 | 4/2018 | Tomishima et al. |
| 2018/0102776 A1 | 4/2018 | Chandrasekar et al. |
| 2018/0107417 A1 | 4/2018 | Shechter et al. |
| 2018/0114561 A1 | 4/2018 | Fisch et al. |
| 2018/0114565 A1 | 4/2018 | Lee |
| 2018/0158504 A1 | 6/2018 | Akamatsu |
| 2018/0182445 A1 | 6/2018 | Lee et al. |
| 2018/0203621 A1 | 7/2018 | Ahn et al. |
| 2018/0218767 A1 | 8/2018 | Wolff |
| 2018/0261268 A1 | 9/2018 | Hyun et al. |
| 2018/0294028 A1 | 10/2018 | Lee et al. |
| 2018/0308539 A1 | 10/2018 | Ito et al. |
| 2018/0341553 A1 | 11/2018 | Koudele et al. |
| 2018/0366182 A1 | 12/2018 | Hyun et al. |
| 2019/0013059 A1 | 1/2019 | Akamatsu |
| 2019/0043558 A1 | 2/2019 | Suh et al. |
| 2019/0051344 A1 | 2/2019 | Bell et al. |
| 2019/0066759 A1 | 2/2019 | Nale |
| 2019/0066762 A1 | 2/2019 | Koya |
| 2019/0088315 A1 | 3/2019 | Saenz et al. |
| 2019/0088316 A1 | 3/2019 | Inuzuka et al. |
| 2019/0096492 A1 | 3/2019 | Cai et al. |
| 2019/0103147 A1 | 4/2019 | Jones et al. |
| 2019/0130961 A1 | 5/2019 | Bell et al. |
| 2019/0139599 A1 | 5/2019 | Ito et al. |
| 2019/0147941 A1 | 5/2019 | Qin et al. |
| 2019/0147964 A1 | 5/2019 | Yun et al. |
| 2019/0161341 A1 | 5/2019 | Howe |
| 2019/0172518 A1 | 6/2019 | Chen et al. |
| 2019/0196730 A1 | 6/2019 | Imran |
| 2019/0198078 A1 | 6/2019 | Hoang et al. |
| 2019/0198090 A1 | 6/2019 | Lee |
| 2019/0198099 A1 | 6/2019 | Mirichigni et al. |
| 2019/0205253 A1 | 7/2019 | Roberts |
| 2019/0207736 A1 | 7/2019 | Ben-Tovim et al. |
| 2019/0228810 A1 | 7/2019 | Jones et al. |
| 2019/0228813 A1 | 7/2019 | Nale et al. |
| 2019/0228815 A1 | 7/2019 | Morohashi et al. |
| 2019/0237132 A1 | 8/2019 | Morohashi |
| 2019/0243708 A1 | 8/2019 | Cha et al. |
| 2019/0252020 A1 | 8/2019 | Rios et al. |
| 2019/0267077 A1 | 8/2019 | Ito et al. |
| 2019/0279706 A1 | 9/2019 | Kim |
| 2019/0333573 A1 | 10/2019 | Shin et al. |
| 2019/0348100 A1 | 11/2019 | Smith et al. |
| 2019/0348102 A1 | 11/2019 | Smith et al. |
| 2019/0348103 A1 | 11/2019 | Jeong et al. |
| 2019/0348107 A1 | 11/2019 | Shin et al. |
| 2019/0349545 A1 | 11/2019 | Koh et al. |
| 2019/0362774 A1 | 11/2019 | Kuramorl et al. |
| 2019/0371391 A1 | 12/2019 | Cha et al. |
| 2019/0385661 A1 | 12/2019 | Koo et al. |
| 2019/0385667 A1 | 12/2019 | Morohashi et al. |
| 2019/0386557 A1 | 12/2019 | Wang et al. |
| 2020/0005857 A1 | 1/2020 | Ito et al. |
| 2020/0075106 A1 | 3/2020 | Tokutomi et al. |
| 2020/0082873 A1 | 3/2020 | Wolff |
| 2020/0090760 A1 | 3/2020 | Purahmad et al. |
| 2020/0135263 A1 | 4/2020 | Brown et al. |
| 2020/0194050 A1 | 6/2020 | Akamatsu |
| 2020/0194056 A1 | 6/2020 | Sakurai et al. |
| 2020/0201380 A1 | 6/2020 | Murali et al. |
| 2020/0202921 A1 | 6/2020 | Morohashi et al. |
| 2020/0211626 A1 | 7/2020 | Hiscock et al. |
| 2020/0211633 A1 | 7/2020 | Okuma |
| 2020/0211636 A1 | 7/2020 | Hiscock et al. |
| 2020/0251158 A1 | 8/2020 | Shore et al. |
| 2020/0294576 A1 | 9/2020 | Brown et al. |
| 2020/0302994 A1 | 9/2020 | Enomoto et al. |
| 2020/0321049 A1 | 10/2020 | Meier et al. |
| 2020/0349995 A1 | 11/2020 | Shore et al. |
| 2020/0365208 A1* | 11/2020 | Schreck ............. G11C 11/4094 |
| 2020/0381040 A1 | 12/2020 | Penney et al. |
| 2020/0395072 A1* | 12/2020 | Penney ................. G11C 15/04 |
| 2021/0005229 A1 | 1/2021 | Hiscock et al. |
| 2021/0005240 A1 | 1/2021 | Brown et al. |
| 2021/0020223 A1 | 1/2021 | Ayyapureddi et al. |
| 2021/0020262 A1 | 1/2021 | Penney et al. |
| 2021/0026732 A1 | 1/2021 | Park et al. |
| 2021/0057012 A1 | 2/2021 | Ayyapureddi et al. |
| 2021/0057013 A1 | 2/2021 | Jenkinson et al. |
| 2021/0057021 A1* | 2/2021 | Wu ................... G11C 11/40603 |
| 2021/0065755 A1 | 3/2021 | Kim et al. |
| 2021/0065764 A1 | 3/2021 | Cheng et al. |
| 2021/0142852 A1 | 5/2021 | Schreck et al. |
| 2021/0158860 A1 | 5/2021 | Wu et al. |
| 2021/0158861 A1 | 5/2021 | Jeong et al. |
| 2021/0201984 A1 | 7/2021 | Khasawneh et al. |
| 2021/0225432 A1 | 7/2021 | Enomoto et al. |
| 2021/0241810 A1 | 8/2021 | Hollis et al. |
| 2021/0265504 A1 | 8/2021 | Ishizu et al. |
| 2021/0343324 A1 | 11/2021 | Brown et al. |
| 2021/0350844 A1 | 11/2021 | Morohashi et al. |
| 2021/0398592 A1 | 12/2021 | Penney et al. |
| 2021/0407583 A1 | 12/2021 | Penney et al. |
| 2022/0165347 A1 | 5/2022 | Pan |

FOREIGN PATENT DOCUMENTS

| | | |
|---|---|---|
| CN | 101038785 A | 9/2007 |
| CN | 101067972 A | 11/2007 |
| CN | 101331554 A | 12/2008 |
| CN | 101458658 A | 6/2009 |
| CN | 101622607 A | 1/2010 |
| CN | 102113058 A | 6/2011 |
| CN | 102483952 A | 5/2012 |
| CN | 104350546 A | 2/2015 |
| CN | 106710621 A | 5/2017 |
| CN | 107871516 A | 4/2018 |
| JP | H0773682 A | 3/1995 |
| JP | 2005-216429 A | 8/2005 |
| JP | 2011-258259 A | 12/2011 |
| JP | 4911510 B2 | 1/2012 |

(56) References Cited

FOREIGN PATENT DOCUMENTS

| | | | |
|---|---|---|---|
| JP | 2013-004158 A | 1/2013 | |
| KR | 20150002112 A | 1/2015 | |
| KR | 20150002783 A | 1/2015 | |
| KR | 20170058022 A | 5/2017 | |
| KR | 1020180064940 A | 6/2018 | |
| KR | 1020180085184 A | 7/2018 | |
| KR | 20190048049 A | 5/2019 | |
| WO | 2014120477 | 8/2014 | |
| WO | 2015030991 A1 | 3/2015 | |
| WO | 2017171927 A1 | 10/2017 | |
| WO | 2019222960 A1 | 11/2019 | |
| WO | 2020191222 A1 | 9/2020 | |
| WO | 2022108808 A1 | 5/2022 | |

OTHER PUBLICATIONS

U.S. Appl. No. 16/818,981 titled "Apparatuses and Methods for Staggered Timing of Targeted Refresh Operations", filed Mar. 13, 2020, pp. all.
U.S. Appl. No. 16/824,460, titled "Semiconductor Device Performing Row Hammer Refresh Operation", filed Mar. 19, 2020, pp. all.
U.S. Appl. No. 16/232,837, titled "Apparatuses and Methods for Distributed Targeted Refresh Operations", filed Dec. 26, 2018, pp. all.
U.S. Appl. No. 16/818,989, titled "Semiconductor Device Performing Row Hammer Refresh Operation", filed Mar. 13, 2020, pp. all.
U.S. Appl. No. 16/286,187 titled "Apparatuses and Methods for Memory Mat Refresh Sequencing", filed Feb. 26, 2019, pp. all.
U.S. Appl. No. 16/084,119, titled "Apparatuses and Methods for Pure-Time, Self Adopt Sampling for Row Hammer Refresh Sampling", filed Sep. 11, 2018, pp. all.
U.S. Appl. No. 16/375,716 titled "Apparatuses and Methods for Staggered Timing of Targeted Refresh Operations", filed Apr. 4, 2019; pp. all.
U.S. Appl. No. 17/060,403 titled "Apparatuses and Methods for Adjusting Victim Data", filed Oct. 1, 2020, pp. all.
U.S. Appl. No. 16/655,110 titled "Apparatuses and Methods for Dynamic Targeted Refresh Steals", filed Oct. 16, 2019, pp. all.
International Application No. PCT/US19/64028, titled "Semiconductor Device Performing Row Hammer Refresh Operation", dated Dec. 2, 2019, pp. all.
International Application No. PCT/US20/26689, titled "Apparatuses and Methods for Staggered Timing of Targeted Refresh Operations", dated Apr. 3, 2020, pp. all.
U.S. Appl. No. 16/788,657, titled "Semiconductor Device Performing Row Hammer Refresh Operation", filed Feb. 12, 2020, pp. all.
U.S. Appl. No. 17/153,555 titled "Apparatuses and Methods for Dynamically Allocated Aggressor Detection", filed Jan. 20, 2021, pp. all.
U.S. Appl. No. 17/201,941 titled "Apparatuses and Methods for Sketch Circuits for Refresh Binning", filed Mar. 15, 2021, pp. all.
U.S. Appl. No. 17/301,533 titled "Semiconductor Device Having Cam That Stores Address Signals", filed Apr. 6, 2021, pp. all.
U.S. Appl. No. 16/208,217, titled "Semiconductor Device Performing Row Hammer Refresh Operation", filed Dec. 3, 2018, pp. all.
U.S. Appl. No. 16/230,300, titled "Apparatuses and Methods for Staggered Timing of Targeted Refresh Operations", filed Dec. 21, 2018, pp. all.
U.S. Appl. No. 16/290,730, titled "Semiconductor Device Performing Row Hammer Refresh Operation", filed Mar. 1, 2019, pp. all.
U.S. Appl. No. 16/374,623, titled "Semiconductor Device Performing Row Hammer Refresh Operation", filed Apr. 3, 2019, pp. all.
U.S. Appl. No. 16/431,641 titled "Apparatuses and Methods for Controlling Steal Rates", filed Jun. 4, 2019, pp. all.
U.S. Appl. No. 16/459,507 titled "Apparatuses and Methods for Adjusting Victim Data", filed Jul. 1, 2019, pp. all.
U.S. Appl. No. 16/783,063, titled "Apparatus and Methods for Triggering Row Hammer Address Sampling", filed Feb. 5, 2020.

U.S. Appl. No. 16/268,818, titled "Apparatuses and Methods for Managing Row Access Counts", filed Feb. 6, 2019.
U.S. Appl. No. 16/936,297 titled "Apparatuses and Methods for Managing Row Access Counts", filed Jul. 22, 2020.
U.S. Appl. No. 16/546,152 titled "Apparatuses and Methods for Analog Row Access Tracking", filed Aug. 20, 2019.
U.S. Appl. No. 16/548,027 titled "Apparatuses, Systems, and Methods for Analog Row Access Rate Determination", filed Aug. 22. 2019.
U.S. Appl. No. 16/549,942 titled "Apparatuses and Methods for Lossy Row Access Counting", filed Aug. 23, 2019.
U.S. Appl. No. 15/881,256 entitled 'Apparatuses and Methods for Detecting a Row Hammer Attack With a Bandpass Filter', filed Jan. 26, 2018.
U.S. Appl. No. 16/425,525 titled "Apparatuses and Methods for Tracking All Row Accesses", filed May 29, 2019.
U.S. Appl. No. 16/427,105 titled "Apparatuses and Methods for Priority Targeted Refresh Operations", filed May 30, 2019.
U.S. Appl. No. 16/427,140 titled "Apparatuses and Methods for Tracking Row Access Counts Between Multiple Register Stacks", filed May 30, 2019.
U.S. Appl. No. 16/537,981 titled "Apparatuses and Methods for Controlling Targeted Refresh Rates", filed Aug. 12, 2019.
U.S. Appl. No. 17/154,945 titled "Apparatuses, Systems, and Methods for a Content Addressable Memory Cell", filed Jan. 21, 2021.
U.S. Appl. No. 17/168,036 titled "Apparatuses and Methods for Analog Row Access Tracking", filed Feb. 4, 2021.
U.S. Appl. No. 15/789,897, entitled "Apparatus and Methods for Refreshing Memory", filed Oct. 20, 2017; pp. all.
U.S. Appl. No. 15/796,340, entitled: "Apparatus and Methods for Refreshing Memory", filed Oct. 27, 2017; pp. all.
U.S. Appl. No. 16/237,291, titled "Apparatus and Methods for Refreshing Memory", filed Dec. 31, 2018.
U.S. Appl. No. 16/427,330 titled "Apparatuses and Methods for Storing Victim Row Data", filed May 30, 2019.
U.S. Appl. No. 16/549,411 titled "Apparatuses and Methods for Dynamic Refresh Allocation", filed Aug. 23, 2019.
U.S. Appl. No. 17/102,266, titled "Apparatuses and Methods for Tracking Word Line Accesses", filed Nov. 23, 2020.
PCT Application No. PCT/US18/55821 "Apparatus and Methods for Refreshing Memory" filed Oct. 15, 2018., pp. all.
Kim, et al., "Flipping Bits in MemoryWithout Accessing Them: An Experimental Study of DRAM Disturbance Errors", IEEE, Jun. 2014, 12 pgs.
Stout, Thomas et al., "Voltage Source Based Voltage-to-Time Converter", IEEE, downloaded Jul. 2020, p. All.
U.S. Appl. No. 17/375,817 titled "Apparatuses and Methods for Monitoring Word Line Accesses", filed Jul. 14, 2021, pp. all.
U.S. Appl. No. 17/443,056 titled "Apparatuses and Methods for Multiple Row Hammer Refresh Address Sequences", filed Jul. 20, 2021, pp. all.
U.S. Appl. No. 17/007,069 titled "Apparatuses and Methods for Providing Refresh Addresses", filed Aug. 31, 2020, pp. all.
U.S. Appl. No. 17/456,849 titled "Apparatuses, Systems, and Methods for Main Sketch and Slim Sketch Circuitfor Row Address Tracking", filed Nov. 29, 2021.
U.S. Appl. No. 17/565,119 titled "Apparatuses and Methods for Row Hammer Counter Mat", filed Dec. 29, 2021.
U.S. Appl. No. 17/565,187 titled "Apparatuses and Methods for Row Hammer Counter Mat", filed Dec. 29, 2021.
U.S. Appl. No. 17/444,925 titled "Apparatuses and Methods for Countering Memory Attacks", filed Aug. 12, 2021, pp. all pages of application as filed.
U.S. Appl. No. 17/446,710 titled "Apparatuses. Systems, and Methods for Determining Extremum Numerical Values", filed Sep. 1, 2021, pp. all pages of application as filed.
U.S. Appl. No. 17/470,883 titled "Apparatuses and Methods for Tracking Victim Rows", filed Sep. 9, 2021, all pages of application as filed.
U.S. Appl. No. 17/932,206, titled, "Apparatuses and Methods for Dynamically Allocated Aggressor Detection" filed Sep. 14, 2022; pp. all pages of application as filed.

(56) References Cited

OTHER PUBLICATIONS

U.S. Appl. No. 17/822,033, titled, "Apparatuses and Methods for Tracking Word Line Accesses" filed Aug. 24, 2022, pp. all pages of application as filed.
[English Abstract] Zheng, Bin, et al., "Design of Built-in DRAM for TFT-LCD Driver Chip LCD and display," Issue 4, Aug. 15, 2009; pp. all.

* cited by examiner

APPARATUSES, SYSTEMS, AND METHODS FOR ANALOG ACCUMULATOR FOR DETERMINING ROW ACCESS RATE AND TARGET ROW ADDRESS USED FOR REFRESH OPERATION

CROSS-REFERENCE TO RELATED APPLICATION(S)

This application is a divisional of U.S. patent application Ser. No. 16/548,027 filed Aug. 22, 2019 and issued as U.S. Pat. No. 10,964,378 on Mar. 30, 2021. The aforementioned application, and issued patent, is incorporated herein by reference, in its entirety, for any purpose.

BACKGROUND

Information may be stored on individual memory cells of the memory as a physical signal (e.g., a charge on a capacitive element). The memory may be a volatile memory, and the physical signal may decay over time (which may degrade or destroy the information stored in the memory cells). It may be necessary to periodically refresh the information in the memory cells by, for example, rewriting the information to restore the physical signal to an initial value.

As memory components have decreased in size, the density of memory cells has greatly increased. An auto-refresh operation may be carried out where a sequence of memory cells are periodically refreshed. Repeated access to a particular memory cell or group of memory cells (often referred to as a 'row hammer') may cause an increased rate of data degradation in nearby memory cells. It may be desirable to identify and refresh memory cells affected by the row hammer in a targeted refresh operation in addition to the auto-refresh operation.

DETAILED DESCRIPTION

Figure 1:
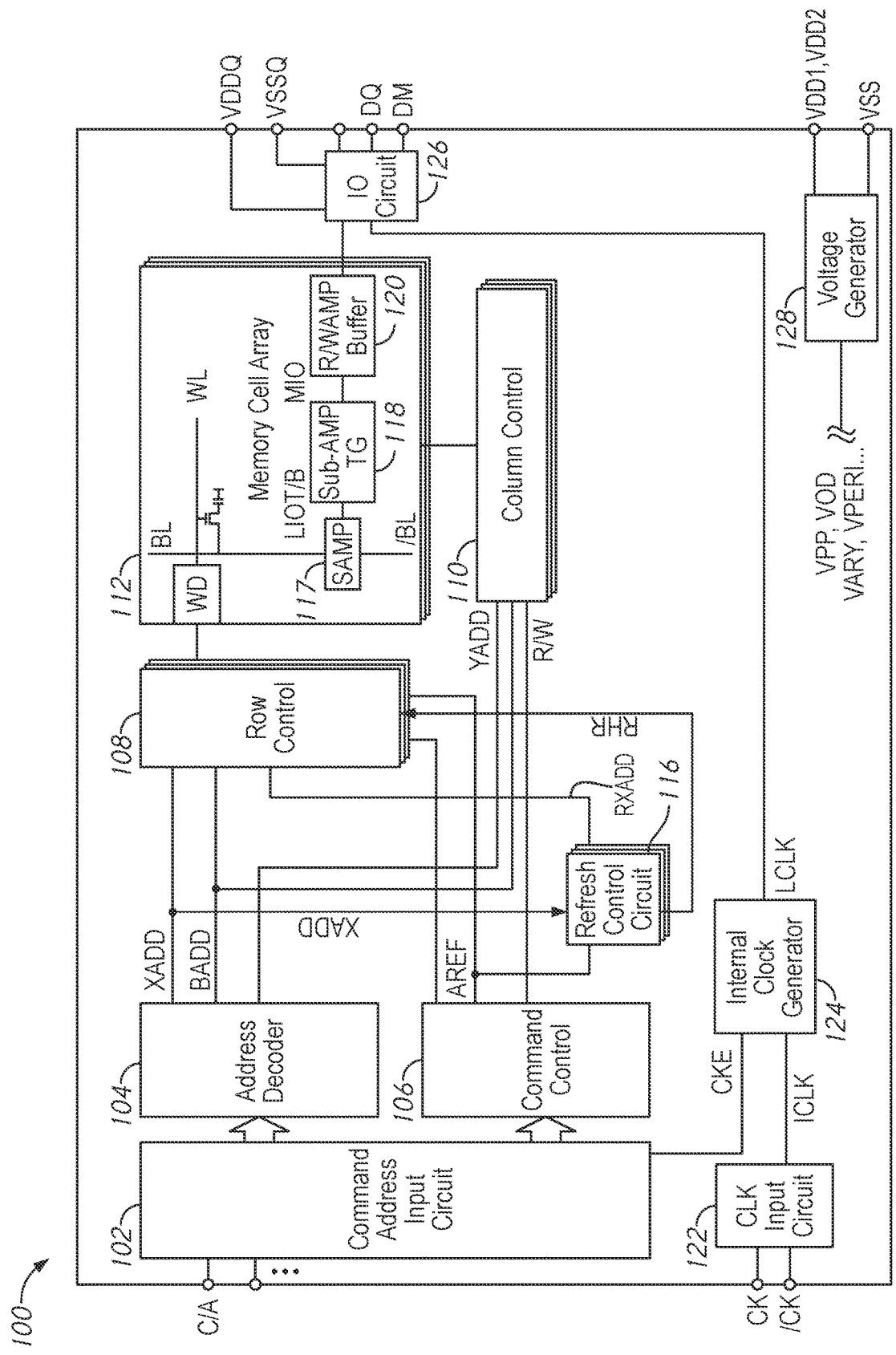
FIG. 1 is a block diagram of a semiconductor device according to at least one embodiment of the disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

A memory device may include a plurality of memory cells. The memory cells may store information (e.g., as one or more bits), and may be organized at the intersection of word lines (rows) and bit lines (columns). Each word line of the memory device may be associated with a row address. When a given word line is accessed, a row address may be provided which specifies which row is being accessed.

Information in the memory cells may decay over time. The memory cells may be refreshed on a row-by-row basis to preserve information in the memory cells. During a refresh operation, the information in one or more rows may be rewritten back to the respective rows to restore an initial value of the information. Repeated accesses to a given row (e.g., an aggressor row) may cause an increased rate of information decay in nearby rows (e.g., victim rows). Victim rows may be refreshed as part of a targeted refresh operation. It may be important to track accesses to word lines of the memory in order to perform targeted refresh operations before information is lost in the victim rows. Tracking accesses as a binary number (e.g., with a counter) may require a relatively large amount of space on a chip. It may be desirable to track accesses in a manner which requires a minimal amount of space and power.

The present disclosure is drawn to apparatuses, systems, and methods for analog row access rate determination. When a row is accessed, its row address may be compared the row addresses stored in the files (e.g., registers) of a stack (e.g., register stack, data storage unit). If there is a match, a match signal may be provided to an accumulator circuit associated with that file. The accumulator circuit includes a capacitor, and responsive to the match signal an amount of charge is added to the capacitor. The accumulator circuit may also allow the charge to drain out of the capacitor over time. The accumulator circuit may provide a voltage based on the current charge on the capacitor. Accordingly, the voltage may represent a rate at which the row stored in the associated file is accessed. Each file may also be associated with a voltage to time (VtoT) circuit, which may use the voltage provided by the associated accumulator circuit to determine which of the files includes an address with a fastest access rate and/or a slowest access rate.

FIG. 1 is a block diagram of a semiconductor device according to at least one embodiment of the disclosure. The semiconductor device 100 may be a semiconductor memory device, such as a DRAM device integrated on a single semiconductor chip.

The semiconductor device 100 includes a memory array 112. In some embodiments, the memory array 112 may include of a plurality of memory banks. Each memory bank includes a plurality of word lines WL, a plurality of bit lines BL and/BL, and a plurality of memory cells MC arranged at intersections of the plurality of word lines WL and the plurality of bit lines BL and/BL. The selection of the word line WL is performed by a row control 108 and the selection of the bit lines BL and /BL is performed by a column control 110. In some embodiments, there may be a row control 108 and column control 110 for each of the memory banks.

The bit lines BL and/BL are coupled to a respective sense amplifier (SAMP) 117. Read data from the bit line BL or/BL is amplified by the sense amplifier SAMP 117, and transferred to read/write amplifiers 120 over complementary local data lines (LIOT/B), transfer gate (TG) 118, and complementary main data lines (MIO). Conversely, write data outputted from the read/write amplifiers 120 is transferred to the sense amplifier 117 over the complementary main data lines MIO, the transfer gate 118, and the complementary local data lines LIOT/B, and written in the memory cell MC coupled to the bit line BL or/BL.

The semiconductor device 100 may employ a plurality of external terminals that include command and address (C/A) terminals coupled to a command and address bus to receive commands and addresses, clock terminals to receive clocks CK and/CK, data terminals DQ to provide data, and power supply terminals to receive power supply potentials VDD, VSS, VDDQ, and VSSQ.

The clock terminals are supplied with external clocks CK and/CK that are provided to a clock input circuit 122. The external clocks may be complementary. The clock input circuit 122 generates an internal clock ICLK based on the CK and/CK clocks. The ICLK clock is provided to the command control 106 and to an internal clock generator 124. The internal clock generator 124 provides various internal clocks LCLK based on the ICLK clock. The LCLK clocks may be used for timing operation of various internal circuits. The internal data clocks LCLK are provided to the input/output circuit 126 to time operation of circuits included in the input/output circuit 126, for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row control 108 and supplies a decoded column address YADD to the column control 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command control 106 via the command/address input circuit 102. The command control 106 includes circuits to decode the internal command signals to generate various internal signals and commands for performing operations. For example, the command control 106 may provide a row command signal to select a word line and a column command signal to select a bit line.

The device 100 may receive an access command which is a row activation command ACT. When the row activation command ACT is received, a bank address BADD and a row address XADD are timely supplied with the row activation command ACT.

The device 100 may receive an access command which is a read command. When a read command is received, a bank address and a column address are timely supplied with the read command, read data is read from memory cells in the memory array 112 corresponding to the row address and column address. The read command is received by the command control 106, which provides internal commands so that read data from the memory array 112 is provided to the read/write amplifiers 120. The read data is output to outside from the data terminals DQ via the input/output circuit 126.

The device 100 may receive an access command which is a write command. When the write command is received, a bank address and a column address are timely supplied with the write command, write data supplied to the data terminals DQ is written to a memory cells in the memory array 112 corresponding to the row address and column address. The write command is received by the command control 106, which provides internal commands so that the write data is received by data receivers in the input/output circuit 126. Write clocks may also be provided to the external clock terminals for timing the receipt of the write data by the data receivers of the input/output circuit 126. The write data is supplied via the input/output circuit 126 to the read/write amplifiers 120, and by the read/write amplifiers 120 to the memory array 112 to be written into the memory cell MC.

The device 100 may also receive commands causing it to carry out refresh operations. A refresh signal AREF may be a pulse signal which is activated when the command control 106 receives a signal which indicates a refresh command. In some embodiments, the refresh command may be externally issued to the memory device 100. In some embodiments, the refresh command may be periodically generated by a component of the device. In some embodiments, when an external signal indicates a self-refresh entry command, the refresh signal AREF may also be activated. The refresh signal AREF may be activated once immediately after command input, and thereafter may be cyclically activated at desired internal timing. Thus, refresh operations may continue automatically. A self-refresh exit command may cause the automatic activation of the refresh signal AREF top and return to an IDLE state.

The refresh signal AREF is supplied to the refresh control circuit 116. There may be a refresh control circuit 116 associated with each bank. The refresh control circuits 116 may receive the refresh signal AREF in common, and may generate and provide one or more refresh row address(es) RXADD in order to perform one or more refresh operations in the associated memory bank. In some embodiments, a subset of the memory banks may be given refresh commands. For example, one or more additional signals may indicate which of the refresh control circuits 116 should provide refresh address(es) responsive to AREF. In another example, AREF may only be provided to refresh control circuits 116 which are associated with the subset of memory banks which are refreshing.

Focusing on the operation of a given refresh control circuit, the refresh control circuit 116 supplies a refresh row address RXADD to the row control 108, which may refresh one or more wordlines WL indicated by the refresh row address RXADD. The refresh control circuit 116 may control a timing of the refresh operation based on the refresh signal AREF. In some embodiments, responsive to an activation of AREF, the refresh control circuit 116 may generate one or more activations of a pump signal, and may generate and provide a refresh address RXADD for each activation of the pump signal (e.g., each pump).

Since the various refresh control circuits are coupled in common to AREF, multiple memory banks of the device 100 may simultaneously perform refresh operations. Each refresh control circuit 116 may be controlled to change details of the refreshing address RXADD (e.g., how the refresh address is calculated, the timing of the refresh addresses), or may operate based on internal logic. The refresh control circuit 116 may direct the associated memory bank to perform different types of refresh operation based on the provided refresh address RXADD.

One type of refresh operation may be an auto-refresh operation. Responsive to an auto-refresh operation the memory bank may refresh a group of rows of the memory, and then may refresh a next group of rows of the memory bank responsive to a next auto-refresh operation. The refresh control circuit 116 may provide a refresh address RXADD which indicates a group of wordlines in the memory bank. The refresh control circuit 116 may generate a sequence of refresh addresses RXADD such that over time the auto-refresh operation may cycle through all the wordlines WL of the memory bank. The timing of refresh operations may be such that each wordline is refreshed with a frequency based on a normal rate of data degradation in the memory cells.

Another type of refresh operation may be a targeted refresh operation. Repeated access to a particular row of memory (e.g., an aggressor row) may cause an increased rate of decay in neighboring rows (e.g., victim rows) due, for example, to electromagnetic coupling between the rows. In some embodiments, the victim rows may include rows which are physically adjacent to the aggressor row. In some embodiments, the victim rows may include rows further away from the aggressor row. Information in the victim rows may decay at a rate such that data may be lost if they aren't refreshed before the next auto-refresh operation of that row. In order to prevent information from being lost, it may be necessary to identify aggressor rows and then carry out a targeted refresh operation where a refresh address RXADD associated with one or more associated victim rows is refreshed.

The refresh control circuit 116 may track accesses to various wordlines of the memory. The refresh control circuit 116 may receive the row address RXADD and may compare it to previously received addresses. The refresh control circuit 116 includes a stack which includes a number of slices. Each slice includes a file configured to store a row address, an accumulator circuit which provides a voltage proportional to a rate at which the address in the file has been received, and a voltage to time (VtoT) circuit which may be used to determine which of the accumulator circuits in the stack is providing the highest voltage. The row address associated with the highest voltage (e.g., the fastest rate of accesses) may have its victims refreshed as part of a targeted refresh operation.

In some embodiments, the refresh control circuits 116 may perform multiple refresh operations responsive to each occurrence of AREF. Each refresh control circuit 116 may generate a number of 'pumps' (e.g., activations of a pump signal) responsive to receiving an activation of AREF. Each pump, in turn, may cause the refresh control circuit 116 to provide a refresh address RXADD, and trigger a refresh operation as indicated by the refresh address RXADD. A given refresh control circuit 116 may provide auto-refresh addresses responsive to some of the pumps and targeted refresh addresses responsive to some of the pumps generated from a given activation of AREF. In some embodiments, the refresh control circuit 116 may perform auto-refresh operations for a certain number of pumps, and then may perform targeted refresh operations for a certain number of pumps. In some embodiments, auto-refresh operations and targeted refresh operations may be dynamically assigned to the pumps. For example, if there are no rows waiting to be refreshed as part of a targeted refresh operation, pumps which would have been used for a targeted refresh operation may be used for an auto-refresh operation instead.

The power supply terminals are supplied with power supply potentials VDD and VSS. The power supply potentials VDD and VSS are supplied to an internal voltage generator circuit 128. The internal voltage generator circuit 128 generates various internal potentials VPP, VOD, VARY, VPERI, and the like based on the power supply potentials VDD and VSS supplied to the power supply terminals. The internal potential VPP is mainly used in the row control 108, the internal potentials VOD and VARY are mainly used in the sense amplifiers SAMP included in the memory array 112, and the internal potential VPERI is used in many peripheral circuit blocks.

The power supply terminals are also supplied with power supply potentials VDDQ and VSSQ. The power supply potentials VDDQ and VSSQ are supplied to the input/output circuit 126. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 126 so that power supply noise generated by the input/output circuit 126 does not propagate to the other circuit blocks.

Figure 2:
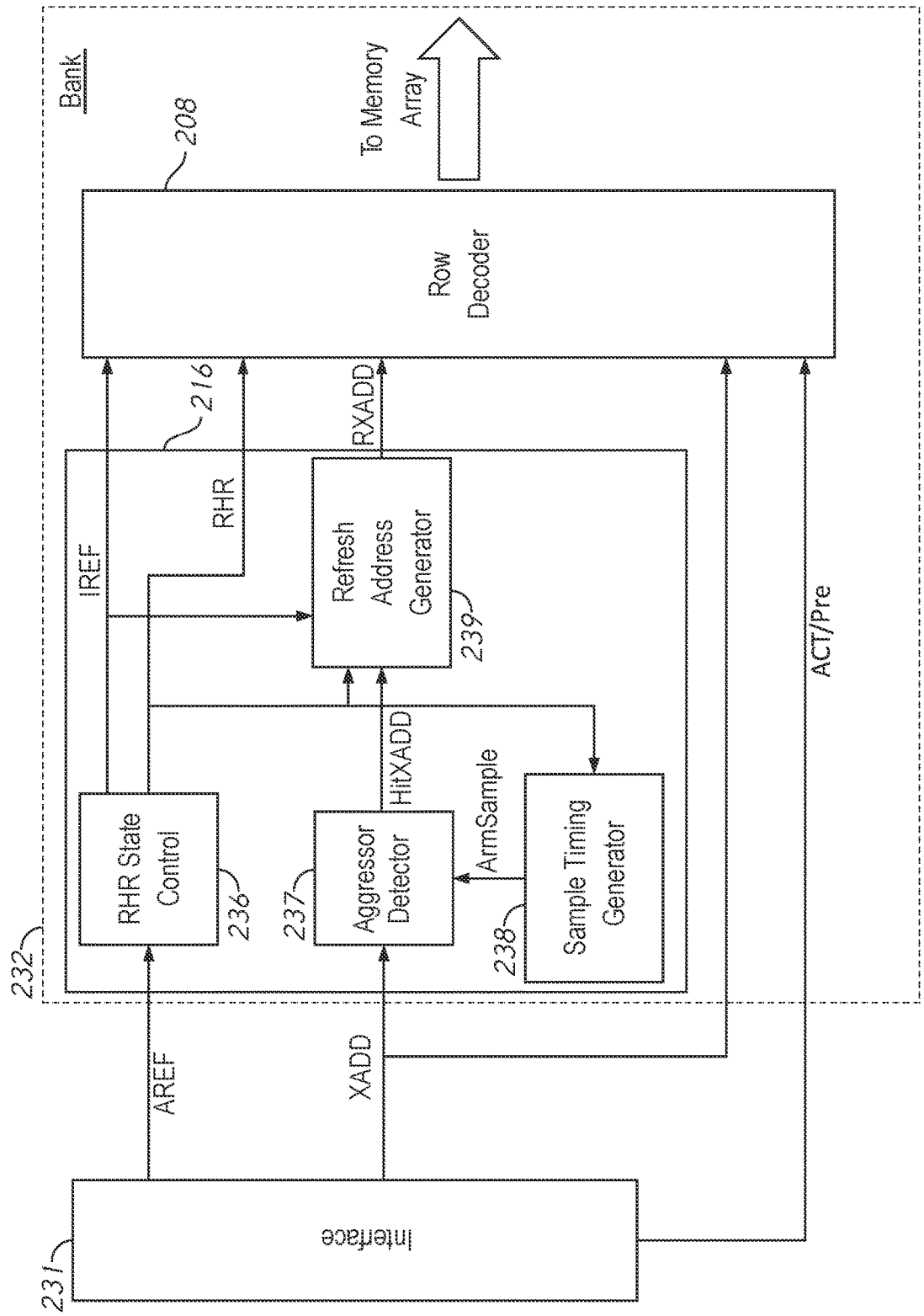
FIG. 2 is a block diagram of a refresh control circuit according to an embodiment of the present disclosure.

FIG. 2 is a block diagram of a refresh control circuit according to an embodiment of the present disclosure. The refresh control circuit 216 may implement the refresh control circuit 116 of FIG. 1 in some embodiments. Certain internal components and signals of the refresh address control circuit 216 are shown to illustrate the operation of the refresh address control circuit 216. The dotted line 232 is shown to represent that in certain embodiments, each of the components (e.g., the refresh address control circuit 216 and row decoder 208) may correspond to a particular bank of memory, and that these components may be repeated for each of the banks of memory. Thus, there may be multiple refresh address control circuits 216 and row decoders 208. For the sake of brevity, only components for a single bank will be described.

An interface 231 may provide one or more signals to an address refresh control circuit 216 and row decoder 208. The refresh address control circuit 216 may include a sample timing generator 238, an aggressor detector circuit 237, a row hammer refresh (RHR) state controller 236 and a refresh address generator 239. The interface 231 may provide one or more control signals, such as an auto-refresh signal AREF, and a row address XADD. The RHR state control 236 may determine if an auto-refresh or a targeted refresh operation should be performed. The RHR state control circuit 236 may indicate different refresh operations in different banks in order to stagger the targeted and auto-refresh operations between the banks.

The example refresh control circuit 216 of FIG. 2 includes a sampling circuit which may be used to sample the row address XADD each time a sampling signal ArmSample is activated. As the row address XADD changes over time, the aggressor detector 237 may only pay attention to the subset of row addresses XADD which coincide with an activation of the sampling signal ArmSample. The sampling signal ArmSample may be provided by the sample timing generator 238 with one or more of periodic timing, random timing, pseudo-random timing, and/or semi-random timing. In other embodiments, the sample timing generator 238 and the sampling signal ArmSample may be omitted, and the aggressor detector 237 may receive all of the row addresses XADD provided by the interface 231.

In the embodiment, shown in FIG. 2, the aggressor detector circuit 237 may sample the current row address XADD responsive to an activation of ArmSample. The sampled address XADD may be compared to previously sampled addresses stored in the aggressor detector circuit 237. The aggressor detector circuit 237 may provide one or more of the stored addresses to the refresh address generator 239 as the matched address HitXADD. The RHR state controller 236 may provide the signal RHR to indicate that a row hammer refresh operation (e.g., a refresh of the victim rows corresponding to an identified aggressor row) should occur. The RHR state controller 236 may also provide an internal refresh signal IREF, to indicate that an auto-refresh operation should occur. The RHR state controller 236 may be used to control the timings of targeted refresh operations and auto-refresh operations. The activations of IREF and RHR may represent activations of the pump signal.

There may be an RHR state controller 236 for each of the different banks. Each RHR state controller 236 may include internal logic which determines the timing with which it provides signals (e.g., RHR) to indicate if a targeted refresh or auto-refresh operation should be performed in the associated bank. In some embodiments, each RHR state controller 236 may include a counter, and may provide the signal RHR based on a number of occurrences of the refresh signal AREF (and/or the number of occurrences of IREF). For example, the RHR state controller 236 may provide the signal IREF m times, then may provide the signal RHR n times, then provide the signal IREF m times, etc.

Responsive to an activation of RHR and/or IREF, the refresh address generator 239 may provide a refresh address RXADD, which may be an auto-refresh address or may be one or more victim addresses corresponding to victim rows of the aggressor row corresponding to the match address HitXADD. The row decoder 208 may perform a refresh operation responsive to the refresh address RXADD and the row hammer refresh signal RHR. The row decoder 208 may perform an auto-refresh operation based on the refresh address RXADD and the internal refresh signal IREF.

The interface 231 may represent one or more components which provides signals to components of the bank. For example, the interface 231 may represent components such as the command address input circuit 102, the address decoder 104, and/or the command control 106 of FIG. 1. The interface 231 may provide a row address XADD, the auto-refresh signal AREF, an activation signal ACT, and a precharge signal Pre. The auto-refresh signal AREF may be a periodic signal which may indicate when an auto-refresh operation is to occur. The activation signal ACT may be provided to activate a given bank of the memory. The precharge signal Pre may be provided to precharge the given bank of the memory. The row address XADD may be a signal including multiple bits (which may be transmitted in series or in parallel) and may correspond to a specific row of an activated memory bank.

The sample timing generator 238 provides the sampling signal ArmSample. ArmSample may alternate between a low logic level and a high logic level. An activation of ArmSample may be a 'pulse', where ArmSample is raised to a high logic level and then returns to a low logic level. The interval between the pulses of ArmSample may be random, pseudo-random, and/or based on one or more signals of the device (e.g., AREF).

The aggressor detector circuit 237 may receive the row address XADD from the interface 231 and ArmSample from the sample timing generator 238. The row address XADD may change as the interface 231 directs access operations (e.g., read and write operations) to different rows of the memory cell array (e.g., memory cell array 112 of FIG. 1). Each time the aggressor detector circuit 237 receives an activation (e.g., a pulse) of ArmSample, the aggressor detector circuit 237 may sample the current value of XADD.

Responsive to an activation of ArmSample, the aggressor detector circuit 237 may determine if one or more rows is an aggressor row based on the sampled row address XADD, and may provide identified aggressor rows as the match address HitXADD. As part of this determination, the aggressor detector circuit 237 may store (e.g., by latching and/or storing the address in a stack) the current value of XADD responsive to the activation of ArmSample if the current value of XADD was not already stored. The current value of XADD may be compared to previously stored addresses in the aggressor detector circuit 237 (e.g., the addresses stored in the stack), to determine access patterns over time of the sampled addresses. If the sampled row address XADD matches one of the previously stored addresses, an amount of charge may be added to a capacitor associated with the stored address. The charge on the capacitor may leak out over time, and thus the charge on the capacitor may be proportional to the frequency at which the stored address is received as the sampled address XADD.

The aggressor detector circuit 237 may use the charge on the different capacitors to identify a row address associated with a highest charge (e.g., a fastest access rate) and with a lowest charge (e.g., a slowest access rate). For example, each capacitor may provide a voltage based on the charge on the capacitor and a highest and lowest voltage may be identified. The address associated with the highest charge may be provided as the match address HitXADD. After being provided as HitXADD, the charge on the capacitor may be reset to an initial value (e.g., a minimum value such as 0). If the sampled address XADD does not match a stored address, it may be stored in one of the files of the stack. If the stack is full (e.g., all of the files are busy) then the address associated with the lowest charge may be replaced with the new address, and the charge may be reset.

The RHR state controller 236 may receive the auto-refresh signal AREF and provide the row hammer refresh signal RHR and the internal refresh signal IREF. The signal RHR may indicate that a targeted refresh operation should take place (e.g., that one or more victim rows associated with the identified aggressor HitXADD should be refreshed). The signal IREF may indicate that an auto-refresh operation should occur. The RHR state controller 236 may use internal logic to provide the RHR signal. In some embodiments, the RHR state controller 236 may include a counter and may provide the RHR signal based on certain number of activations of AREF (e.g., every $4^{th}$ activation of AREF). The counter may be initialized to a particular value (e.g., when the memory is powered on). The particular value may vary from refresh control circuit to refresh control circuit between banks.

The RHR state controller 236 may also provide an internal refresh signal IREF, which may control the timing of refresh operations. In some embodiments, there may be multiple activations of IREF for each activation of the refresh signal AREF. In some embodiments, the internal refresh signal IREF may be used as a refresh pump signal to control the activations of refresh pumps. In some embodiments, each activation of AREF may be associated with a number of activations of IREF, which may be associated with a number of refresh operations, which may be a mix of targeted refresh operations and auto-refresh operations. For example, each activation of IREF may be associated with a refresh operation on the refresh address RXADD, while the state of RHR may determine if the refresh address RXADD is associated with an auto-refresh operation or a targeted refresh operation. In some embodiments, the signal IREF may be used to indicate that an auto-refresh operation should occur, while the signal RHR is used to indicate that a targeted refresh operation should occur. For example, the signals RHR and IREF may be generated such that they are not active at the same time (e.g., are not both at a high logic level at the same time) and each activation of IREF may be associated with an auto-refresh operation, while each activation of RHR may be associated with a targeted refresh operation.

In some embodiments, the RHR state controller 236 may count activations of IREF and use the count of IREF (e.g., the pumps) to determine when the signal RHR should be provided. Similar to previously described, the counter may initialize to a different value for different refresh control circuits. In some embodiments, the RHR state controller 236 may receive one or more signals from an RHR bank stagger circuit, which may direct the different RHR state controllers 236 to provide the signal RHR. In either of these manner targeted and auto-refresh operations may be staggered between banks.

The refresh address generator 239 may receive the row hammer refresh signal RHR and the match address HitXADD. The match address HitXADD may represent an aggressor row. The refresh address generator 239 may determine the locations of one or more victim rows based on the match address HitXADD and provide them as the refresh address RXADD. In some embodiments, the victim rows may include rows which are physically adjacent to the aggressor row (e.g., HitXADD+1 and HitXADD−1). In some embodiments, the victim rows may also include rows which are physically adjacent to the physically adjacent rows of the aggressor row (e.g., HitXADD+2 and HitXADD−2). Other relationships between victim rows and the identified aggressor rows may be used in other examples.

The refresh address generator 239 may determine the value of the refresh address RXADD based on the row hammer refresh signal RHR. In some embodiments, when the signal RHR is not active, the refresh address generator 239 may provide one of a sequence of auto refresh addresses as the refresh address RXADD. When the signal RHR is active, the refresh address generator 239 may provide a targeted refresh address, such as a victim address, as the refresh address RXADD.

The row decoder 208 may perform one or more operations on the memory array (not shown) based on the received signals and addresses. For example, responsive to the activation signal ACT and the row address XADD (and IREF and RHR being at a low logic level), the row decoder 208 may direct one or more access operations (for example, a read operation) on the specified row address XADD. Responsive to the RHR signal being active, the row decoder 208 may refresh the refresh address RXADD.

Figure 3A:
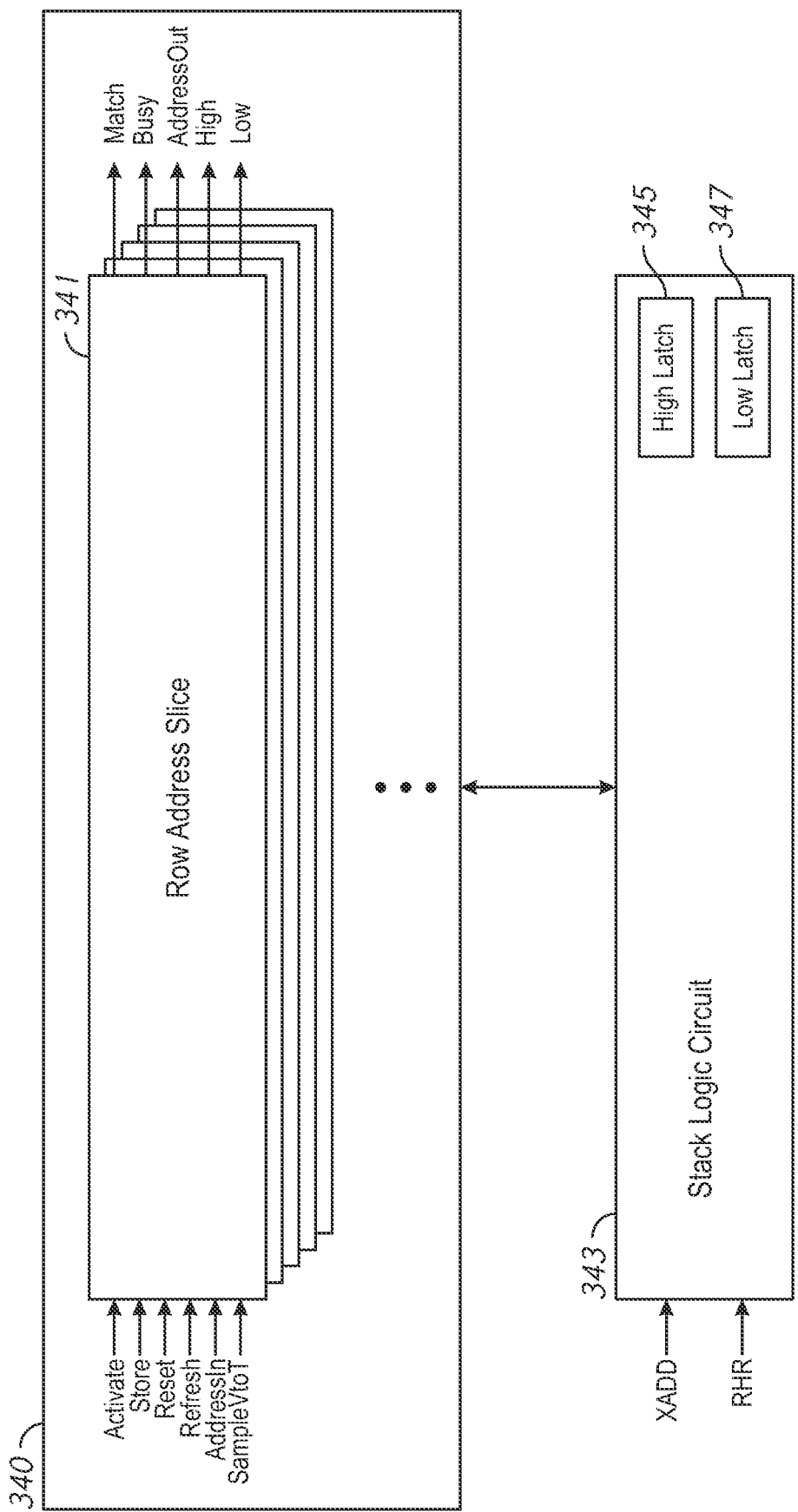
FIGS. 3A-3B are block diagrams of a stack and slices of the stack, respectively, according to an embodiment of the present disclosure.
Figure 3B:
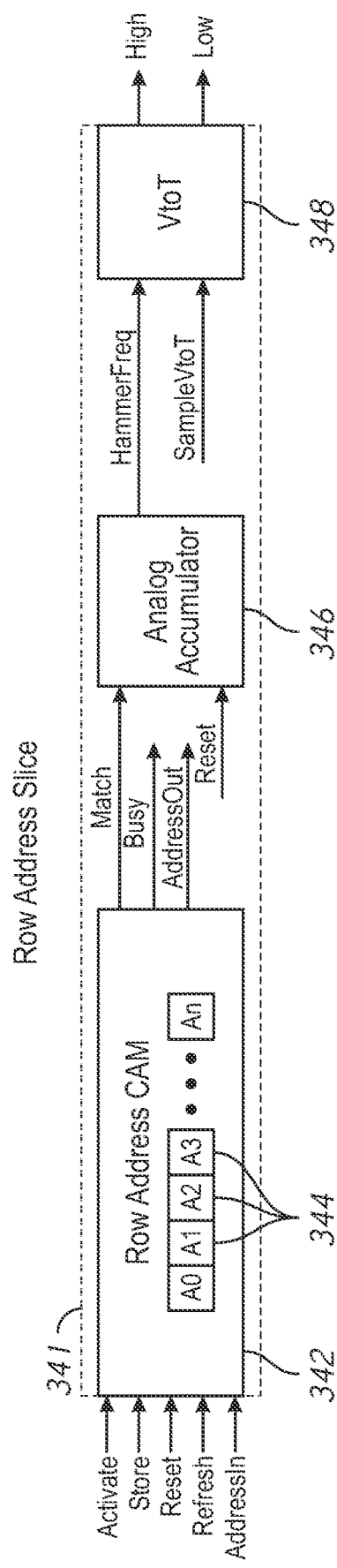

FIGS. 3A-3B are block diagrams of a stack and slices of the stack, respectively, according to an embodiment of the present disclosure. The stack 340 and stack logic circuit 343 of FIG. 3A may be used to implement the aggressor detector circuit 237 of FIG. 2 in some embodiments. The stack 340 includes a number of slices 341. As shown in FIG. 3B, each slice includes a file 342, which includes a number of content addressable memory (CAM) cells 344, an accumulator circuit 346, and a voltage to time (VtoT) circuit 348.

The stack 340 may be used to store received addresses (e.g., row address XADD of FIG. 2) and track accesses to the stored addresses. The stack 340 includes a number of slices 341 each of which includes components which may be used to track accesses to a row address stored in the file 342. The stack logic circuit 343 provides control signals to the stack 340, and receives signals from the stack 340 in order to operate the stack 340.

Each slice 341 includes a file 342 which stores a row address. The file includes a number of CAM cells 344, each of which stores one of the bits of the row address. Each CAM cell 344 includes a latch portion which stores the bit of the address and a comparator portion. The comparator portions of the CAM cells 344 in a slice 341 may work together to determine if a received address AddressIn is an exact match for the row address stored in the file 342 when the control signal Activate is active. In some embodiments, the control signal Activate may be based on an access signal of the memory device, such as ACT/Pre of FIGS. 1-2. In some embodiments, the control signal Activate may be based on a sampling signal, such as ArmSample of FIG. 2. The CAM cells 344 provide a signal Match which indicates if the received address AddressIn is a match or not.

The file 342 may include a number of CAM cells 344 based on the number of bits of information stored in the file 342. The number of CAM cells 344 in a given file 342 may generally be referred to as a 'width' of the file 342. In some embodiments, the file 342 may have a width which is the number of bits of a row address (e.g., XADD). In some embodiments, the file 342 may include additional width, which may be used to store one or more other pieces of information associated with the slice 341. For example, additional CAM cells 344 may be included in the file 342 to store a busy signal Busy, which may be used to indicate if the slice 341 is storing an unrefreshed row address or not.

The file 342 may also receive control signals such as the write signal Store, which may cause the file 342 to write the value of the received address AddressIn to the CAM cells 344, storing the received address AddressIn in the file 342. The file 342 may also receive the signal Reset which, in some embodiments, may cause the file 342 to reset the address stored in the file 342 (e.g., by setting the bits stored in the CAM cells all to the same value). The file 342 also provides a signal Busy, which indicates if the file 342 is currently storing an address or not. Accordingly, before being reset, the file 342 may provide the signal Busy at a first state (e.g., a high logical level), and may provide the signal Busy at a second state (e.g., a low logical level) after being reset. In some embodiments, one or more CAM cells 344 may be used to store the state of the Busy signal. An example CAM cell 344 and its operation is discussed in more detail in FIG. 4.

Each slice 341 also includes an accumulator circuit 346 which tracks accesses to the row address stored in the file

342. Each time the accumulator circuit 346 receives the signal Match, it may update a physical signal stored in the accumulator circuit 346. For example, the accumulator circuit 346 may include a capacitor, and each time the signal Match is received from the file 342, an amount of charge may be added to the capacitor. The accumulator circuit may provide a voltage HammerFreq which is based on the amount of charge on the capacitor. Accordingly each time Match is received, the voltage HammerFreq may be increased. The capacitor in the accumulator circuit 346 may also slowly discharge over time, which may cause the voltage HammerFreq to decrease at a certain rate. Responsive to the signal reset, the voltage HammerFreq may be reset to an initial value (e.g., by discharging the capacitor). An example accumulator circuit and its operation are discussed in more detail in FIG. 5.

The voltage to time (VtoT) circuit 348 may be used to determine which of the different voltages HammerFreq in the stack 340 is the highest and the lowest. Since the voltage HammerFreq may be proportional to the rate at which the row address stored in the file 342 is received, the VtoT circuit 348 may be used to indicate which of the row addresses in the stack 340 is the most and least frequently accessed.

Each VtoT circuit 348 may include a high VtoT circuit and a low VtoT circuit, which may provide the signals High and Low respectively with timing based on the voltage HammerFreq received from the accumulator circuit 346. The VtoT circuit 348 may provide the signals High and Low responsive to the signal SampleVtoT. Once the signal SampleVtoT is provided, the higher the voltage HammerFreq, the faster the signal High is provided by the VtoT circuit 348 and the lower the voltage HammerFreq the faster the signal Low is provided by the VtoT circuit 348. The stack logic circuit 343 may keep track of which of the slices 341 provides the signals High and Low first each time the signal SampleVtoT is provided. An example VtoT circuit and its operation are discussed in more detail in FIG. 6.

Referring back to FIG. 3A, the stack logic circuit 343 may operate the stack 340 by providing addresses and command signals to the stack 340. For example, when an address XADD is received (e.g., from interface 231 of FIG. 2) as part of an access operation, the stack logic circuit 343 may provide the address XADD to the stack as the address AddressIn along with the signal Activate, which may cause the slices 341 to compare the address AddressIn to the stored addresses in their respective files 342. Based on that comparison, each of the files 342 may provide the signal Match.

The stack logic circuit 343 may examine the match signals provided by each file 342 of the stack 340 to determine if there were any matches between the address XADD and the stored addresses. If there is a match, then the signal Match is provided by the file 342 containing the matched address (e.g., the file 342 provides the signal Match at a high logical level) which in turn updates the voltage HammerFreq provided by the accumulator circuit 346. If there is not a match (e.g., the signal Match is provided at a low logical level), then the address XADD may be stored in the stack 340 (e.g., by providing it as the address AddressIn along with the write signal Store to a particular file 342).

After providing a received address XADD for comparison, the stack logic circuit 343 may provide the signal SampleVtoT (e.g., provide SampleVtoT at a high logical level) in order to determine which of the files 342 contains a row address which is accessed the most (e.g., has the highest voltage HammerFreq) and least (e.g., has the lowest voltage HammerFreq). Responsive to the signal SampleVtoT each of the VtoT circuits 348 may provide the signals High and Low. The signal High is provided faster the higher the voltage HammerFreq is, and the signal Low is provided faster the lower the voltage HammerFreq is. The stack logic circuit 343 includes a high latch 345 which latches the first signal High to be provided and a low latch 347 which latches the first signal Low to be provided. In this manner, the signals stored in the high latch 345 and low latch 347 may represent the row addresses of the stack 340 which are most and least frequently accessed respectively.

In some embodiments, each slice 341 may include a high latch 345 and a low latch 347. Each of the high and low latches in the slices 341 may record the value of the signals High and Low, respectively when they are provided (e.g., when they switch from a low logical level to a high logical level). The first high latch 345 and the first low latch 347 to store their respective signal at a high logical level may be maintained, while all of the other high and low latches are cleared (e.g., reset to a low logical level). In this manner, only the first high latch 345 and the first low latch 347 to store a high logical level remain holding a high logical level, which may be used to identify the slices 341 which contain the highest and lowest voltages HammerFreq, respectively, at the most recent time the signal SampleVtoT was provided.

When the stack logic circuit 343 is storing a new address XADD in the stack 340 (e.g., because address XADD did not match any addresses stored in the stack 340), the stack logic circuit 343 may determine if there are any available slices 341. For example the stack logic circuit 343 may check the status of the busy signals Busy provided by the files 342 to determine if any of the signals Busy indicate that at least one row is not busy. If any files 342 are not busy (e.g., the signal Busy is at a second state/low logical level), the new address XADD may be stored in one of the non-busy files 342 (e.g., by providing XADD as AddressIn along with the write signal Store to that file 342). If all of the files 342 are busy, the stack logic circuit 343 may reset the slice 341 indicated by the low latch 347 and may then store the received address XADD in that reset slice 341.

When the stack logic circuit 343 receives a signal (such as the signal RHR) which indicates that a targeted refresh should be performed, the stack logic circuit 343 may provide the address in the slice 341 indicated by the high latch 345. The stack logic circuit 343 may provide the signal Refresh to the stack, which in turn may cause the stack 340 to provide the address from the file 342 associated with the highest access rate (e.g., as indicated by the high latch 345) as the address AddressOut. The address provided as AddressOut may be provided as the match address HitXADD of FIG. 2, and its victims may be refreshed. Responsive to providing an address, the stack logic circuit 343 may provide the reset signal Reset to the slice 341 and may then send the signal SampleVtoT to update the slices 341 stored in the high latch 345 and low latch 347.

Figure 4:
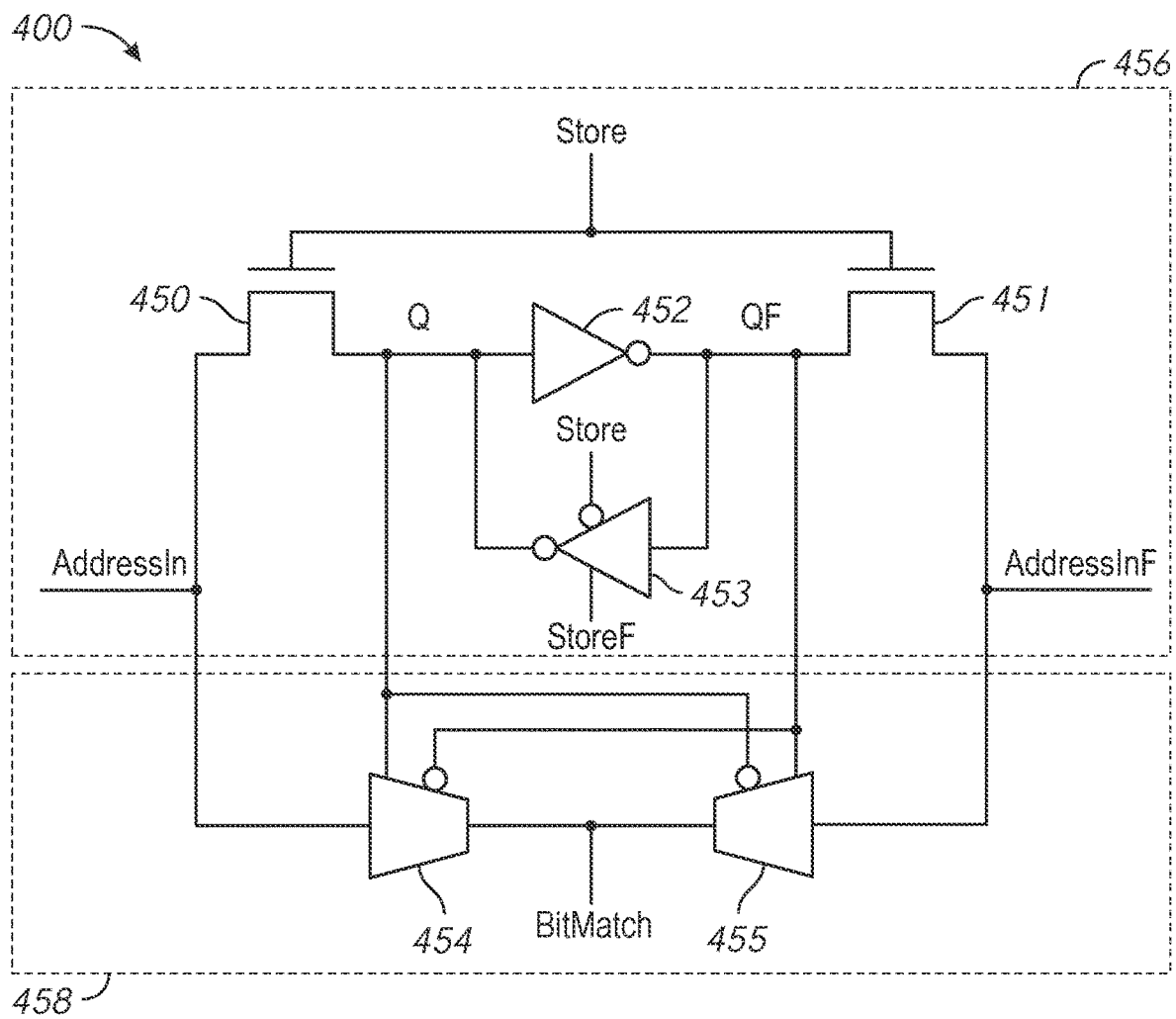
FIG. 4 is a schematic diagram of a content addressable memory (CAM) cell according to an embodiment of the present disclosure.

FIG. 4 is a schematic diagram of a content addressable memory (CAM) cell according to an embodiment of the present disclosure. The CAM cell 400 may, in some embodiments, implement the CAM cells 344 of FIG. 3B. In other embodiments, other types of CAM cell may be used. In general, the CAM cell 400 may store, provide, and/or receive a number of signals, which may represent the states of binary bits. Accordingly, each signal may have a high level, which may be represented by a system voltage (e.g., VPERI) and a low level, which may be represented by a ground voltage (e.g., VSS). Other methods of representing the states of the bits and signals of the CAM cell 400 may be used in other example embodiments.

The CAM cell 400 includes a latch portion 456 and a comparator portion 458. The latch portion stores a bit with a state represented by stored signal Q and inverse stored signal QF. The stored signals Q and QF may be complementary to each other. Thus, if the signal Q is at a high logical level, the signal QF may be at a low logical level, and vice versa. The latch portion 456 includes a pair of cross coupled inverters, a first inverter 452, and a second inverter 453 which may be used to store the values of the signals Q and QF (and thus the value of the stored bit).

The first inverter 452 has an input terminal coupled to a node which carries the signal Q, and an output terminal coupled to a node which carries the signal QF. The second inverter 452 has an input terminal which is coupled to a node which carries the signal QF and an output terminal which is coupled to the node which carries the signal Q. In this manner, the first inverter 452 provides the signal QF at a level complementary to the signal Q, and the second inverter 453 provides the signal Q at a level complementary to the signal QF.

An external bit may be received along with a write signals Store, which may cause the external bit to overwrite the value of the stored bit. The external bit may be provided as the signals AddressIn and AddressInF, which are complementary to each other. The external bit may be a bit of a received address (e.g., XADD of FIGS. 3A-3B). The latch portion 456 includes a first transistor 450 and a second transistor 451 which work together as switches to couple the external signals AdressIn and AddressInF into the cross coupled inverters 452, 453. The first transistor 450 has a drain coupled to the node carrying the stored signal Q, and a source coupled to the external signal AddressIn. The second transistor 451 has a drain coupled to the external signal AddressInF and a source coupled to the stored signal QF. Both the first and second transistors 450, 451 may be n-type transistors, and their gates may be coupled in common to the write signal Store.

In an example write operation, the latch portion 456 may receive the write signal Store at a high level (e.g., a system voltage such as VPERI) and an external bit represented by signals AdressIn and AdressInF. The write signal Store may activate both the first and the second transistors 450, 451, which may couple the signal AdressIn to the signal Q, and the signal AdressInF to the signal QF. The value of the signals AdressIn and AddressInF may overwrite the values. The write signal Write may also inactivate one (or more) of the inverters, 452, 453. In the example CAM cell 400 of FIG. 4, the second inverter 453 has an inverting control terminal coupled to Store and a non-inverting control terminal coupled to a signal StoreF which is complementary to the signal Store. Accordingly, the signal Store being at a high level may inactivate the second inverter 453. This may prevent the inverters 452, 453 from interacting while the write operation is taking place.

The inverter portion 458 includes a first multiplexer 454 and a second multiplexer 455. During a comparison operation, an external bit may be compared to the stored bit, by providing the comparison bit as represented by the signals AdressIn and AdressInF when the write signal Store is at a low level. The multiplexers 454, 455 may work together so that if the external bit matches a state (e.g., a logical level) of the stored bit, the signal BitMatch is provided at a high level, and if they bits do not match, then the signal BitMatch is provided at a low level. The state of the overall match signal Match may be based on the states of the bit match signals BitMatch from each of the CAM cells 400 in a file.

The first multiplexer 454 has an input terminal coupled to the external signal AddressIn, a command terminal coupled to the signal Q, and an inverse command terminal coupled to the signal QF. The output of the first multiplexer is coupled to the signal Match. When the stored signal Q is at a high level (and the signal QF is at a low level) the first multiplexer 454 may couple the signal AdressIn to the signals BitMatch. Accordingly, only if the external signal AdressIn is high and the stored signal Q is high is a high signal coupled to the signal BitMatch through the first multiplexer 454.

The second multiplexer 455 has an input terminal coupled to AdressInF, a command terminal coupled to the signal QF, and an inverse command terminal coupled to the signal Q. The output of the second multiplexer 455 is coupled to the signal BitMatch. When the signal QF is at a high level (and thus the signal Q is at a low level) the second multiplexer 455 may couple the signal AdressInF to the signal BitMatch. Accordingly, only if the external signal AddressInF is high (indicating that the external bit is a low logical level) and the stored signal QF is high (indicating that the stored signal is at a low logical level) is a high signal coupled to the signal BitMatch through the second multiplexer 455.

In some embodiments, multiple CAM cells 400 may be grouped together to store multiple bits of information. For example, multiple CAM cells 400 may be grouped together to form a file which stores a row address, such as the file 342 of FIG. 3B. There may be a number of CAM cells 400 equal to a number of bits of a row address (for example 16 bits). When external data such as a row address is provided, it may be split and a different bit of the external data may be provided to each of the CAM cells 400 as the external signals AddressIn and AddressInF. In some embodiments, there may be additional inverter circuits (not shown) which may receive the external bit and invert it to provide the signal AddressInF. In some embodiments, all of the CAM cells 400 which store the different bits of a piece of data may have their signals BitMatch provided to input terminals of logic with an AND function, such that a signal Match is provided which is at a high level only if all of the individual signals BitMatch from the different CAM cells 400 were at a high level.

Figure 5:
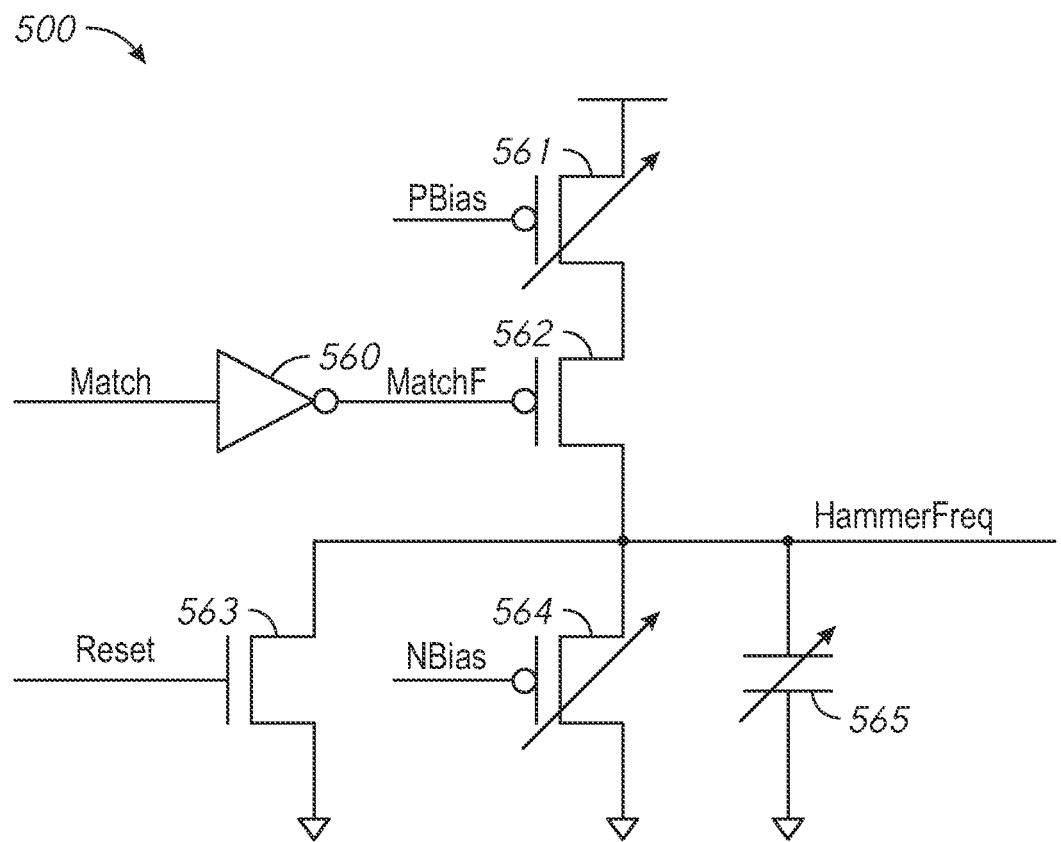
FIG. 5 is a schematic diagram of an example accumulator circuit according to an embodiment of the present disclosure.

FIG. 5 is a schematic diagram of an example accumulator circuit according to an embodiment of the present disclosure. The accumulator circuit 500 may, in some embodiments, implement the accumulator circuit 346 of FIG. 3B. The accumulator circuit 500 receives the signal Match from a file (e.g., file 342 of FIG. 3B). In some embodiments, the signal Match may represent a signal which is a logical AND of the match signal outputs of multiple CAM cells. Responsive to the signal Match, a voltage HammerFreq may be increased.

The accumulator circuit 500 includes a first transistor 561, a second transistor 562, and a third transistor 564. The first transistor has a gate coupled to a bias voltage PBias, a source coupled to a system voltage (e.g., VPERI) and a drain coupled to a source of the second transistor 562. The first transistor 561 may be a p-type transistor. The voltage PBias may generally keep the first transistor 561 in an active state.

The second transistor 562 has a source coupled to the drain of the first transistor 561 and a drain coupled to a node carrying the voltage HammerFreq. The signal match may be provided to an inverter 560, which provides a signal MatchF to the gate of the second transistor 562. The second transistor 562 may be a p-type transistor. Accordingly, when the signal Match is high, the signal MatchF is low, which may activate the second transistor, coupling the system voltage (e.g., VPERI) through the first and second transistors, 561, 562 to the voltage HammerFreq.

The third transistor 564 has a drain coupled to the voltage HammerFreq and a source coupled to a ground voltage (e.g., VSS). The gate of the third transistor 564 is coupled to a bias voltage NBias, which may generally keep the third transistor 564 in an active state. The third transistor 564 may be an n-type transistor.

The voltage HammerFreq is coupled to ground via a capacitor 565. Accordingly, each time the signal Match is provided, the second transistor 562 may activate and the capacitor 565 may be coupled to the system voltage VPERI through the first and second transistors 561, 562. This may add an amount of charge to the capacitor 565 which may increase the voltage HammerFreq. In some embodiments, the amount of charge added for each activation of Match may be adjusted by varying one or more of the length of time Match is active, the characteristics of the transistor 561, and/or the voltage PBias. In some embodiments, the amount that the voltage HammerFreq changes with each activation of Match may also be adjusted by adjusting the capacitance of the capacitor 565.

The capacitor 565 may also be constantly discharging through the third transistor 564, which may be activated by NBias to allow the voltage HammerFreq to leak by permitting a leak current to flow through the third transistor 564 to a ground voltage (e.g., VSS). This may cause the voltage HammerFreq to decrease over time. In some embodiments, the rate at which the capacitor 565 discharges (and HammerFreq decreases over time) may be adjusted by adjusting one or more of the capacitance of the capacitor 565, the characteristics of the third transistor 564, and/or the bias voltage NBias.

In this manner, the voltage HammerFreq may be increased each time an activation of the signal Match is received and may otherwise decrease steadily over time. Thus, the more rapidly that activations of the signal Match are received, the higher the voltage HammerFreq may become. Since the voltage HammerFreq may saturate as the capacitor 565 reaches a maximum amount of charge, it may be important to adjust parameters to prevent saturation for expected rates of Match activation (e.g., expected rates at which a given row may be accessed before it is refreshed). Parameter such as the capacitor 565, the first and third transistors 561, and 564, and the voltages PBias and NBias may be adjusted to reduce the likelihood of saturation conditions form occurring.

A fourth transistor 563 may act as a switch which resets the voltage HammerFreq by discharging the capacitor 565. The fourth transistor has a drain coupled to the voltage HammerFreq and a source coupled to a ground voltage (e.g., VSS). The gate of the fourth transistors 563 is coupled to the signal Reset. The fourth transistor 563 may be an n-type transistor. When the signal Reset is provided at a high level, the fourth transistor 563 may be active, and may couple the voltage HammerFreq to the ground voltage, which may discharge the capacitor 565. The signal Reset may generally be provided at a low level during normal operations to keep the fourth transistor 563 inactive so that the voltage HammerFreq may increase responsive to the signal Match.

Figure 6:
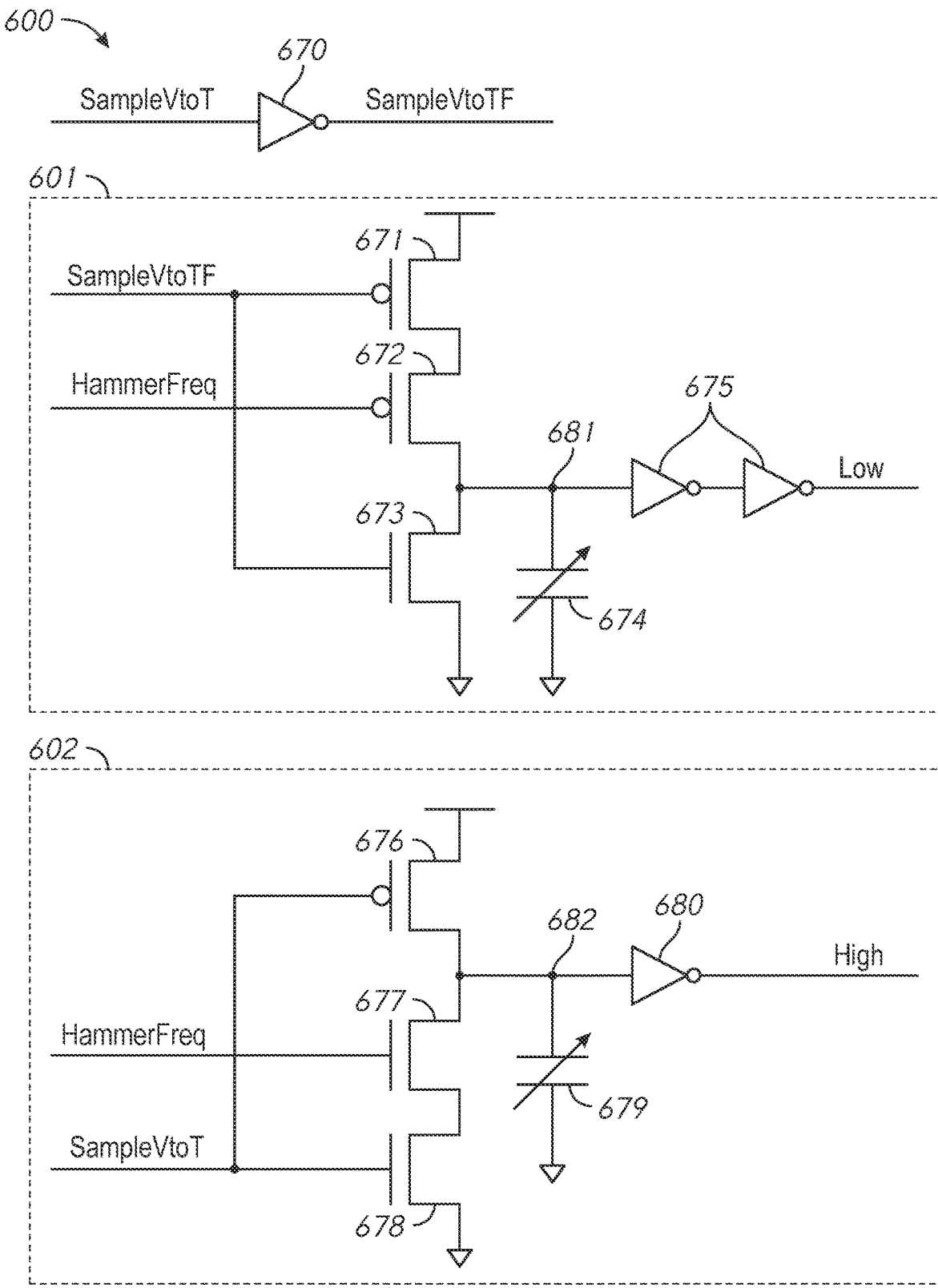
FIG. 6 is a schematic diagram of a voltage to time (VtoT) circuit according to an embodiment of the present disclosure.

FIG. 6 is a schematic diagram of a voltage to time (VtoT) circuit according to an embodiment of the present disclosure. The VtoT circuit 600 may, in some embodiments, implement the VtoT circuit 348 of FIG. 3B. The VtoT circuit 600 may provide a signal High and a signal Low with a speed which is proportional to the voltage HammerFreq which is provided by an accumulator circuit (e.g., 346 of FIG. 3B and/or 500 of FIG. 5).

The VtoT circuit 600 includes a low VtoT circuit 601 and a high VtoT circuit 602. The low VtoT circuit 601 provides the signal Low, and the high VtoT circuit 602 provides the signal High. The VtoT circuit 600 receives a sampling signal SampleVtoT which causes the low and high VtoT circuits 601, 602 to begin the process of providing the signals Low and High. The signal SampleVtoT is provided to an inverter, which provides the signal SampleVtoTF, which is complementary to the signal SampleVtoT.

The low VtoT circuit 601 includes a first transistor 671, a second transistor 672, and a third transistor 673. The first transistor 617 has a source coupled to a system voltage (e.g., VPERI) and a drain coupled to a source of the second transistor 672. The gate of the first transistor 671 is coupled to the signal SampleVtoTF. The second transistor 672 has a source coupled to the drain of the first transistor 671 and a drain coupled to a node 681. The gate of the second transistor 672 is coupled to the voltage HammerFreq. The first and second transistors 671, 672 may be p-type transistors. The third transistor 673 has a drain coupled to the node 681 and a source coupled to a ground voltage (e.g., VSS). The gate of the third transistor 673 is coupled to the signals SampleVtoTF. The third transistor 673 may be an n-type transistor. The node 681 is coupled to a ground voltage (e.g., VSS) via a capacitor 674. The voltage on the node 681 is provided as an input to a pair of inverters 675 coupled in series, the second of which provides the signal Low.

When the low VtoT circuit 601 is not in operation, the signal SampleVtoT may be provided at a low level, which in turn may cause the signal SampleVtoTF to be provided at a high level. This may inactivate the first transistor 671 and activate the third transistor 673. Accordingly, the node 681 may be coupled to the ground voltage via the third transistor 673, and the capacitor 674 may be discharged. Since the node 681 is grounded (e.g., a low level), the pair of inverters 675 may provide the signal Low at a low level.

When the stack (e.g., stack 340 of FIG. 3A) is polled to determine a highest and lowest of the voltages HammerFreq provided by the accumulator circuits, the signal SampleVtoT may be provided at a high level. Accordingly, the inverter 670 may provide the signal SampleVtoTF at a low level. This may inactivate the third transistor 673 and activate the first transistor 671. Current may flow through the first transistor 671 and through the second transistor 672 to the node 681, which may charge the capacitor 674 and increase the voltage on the node 681. The amount of current which flows to the node 681, and thus the speed at which the capacitor 674 charges and the voltage on the node 681 increases, may be based on the voltage HammerFreq applied to the gate of the second transistor 672. In particular, the higher the voltage HammerFreq is, the less current flows through the second transistor 672, and the slower the voltage of the node 681 increases, while the lower the voltage HammerFreq is, the more current flows and the faster the voltage of the node 681 increases.

Once the voltage of the node 681 increases above a threshold voltage of the pair of inverters 675, the inverters change the state of the signal Low to a high level. Since the speed at which the voltage of the node 681 increases is dependent on the voltage of HammerFreq, the time between when SampleVtoT is provided at a high level and when the signal Low switches from a low level to a high level may also be dependent on the voltage HammerFreq, with lower voltages leading to shorter times.

The high VtoT circuit 602 operates on a similar principle to the low VtoT circuit 601, except that the signal High is provided at a high level with a faster timer the higher that the voltage HammerFreq is. The high VtoT circuit 602 includes a first transistor 676 with a source coupled to a system voltage (e.g., VPERI) and a drain coupled to a node 682. A second transistor 677 has a drain coupled to the node 682 and a source coupled to a drain of a third transistor 678. The source of the third transistor 678 is coupled to a ground voltage (e.g., VSS). The gates of the first transistor 676 and the third transistor 678 are coupled to the signal SampleVtoT. The gate of the second transistor 677 is coupled to the voltage HammerFreq. The first transistor 676 may be a p-type transistor. The second transistor 677 and the third transistor 678 may be n-type transistors. The node 682 is coupled to ground through a capacitor 679. An inverter 680 provides the signal High with a level based on the voltage on the node 682.

When the VtoT circuit 600 is not in operation, the signal SampleVtoT may be provided at a low level. This may inactivate the third transistor 678 and activate the first transistor 676. Accordingly the node 682 may be coupled to the system voltage (e.g., VPERI) through the first transistors 676. This may charge the capacitor 679 to a saturation level, which may raise the voltage on the node 682 to a maximum level (e.g., VPERI). This may cause the inverter 680 to provide the voltage High at a low level.

When the VtoT circuit 600 is polled, the signal SampleVtoT is switched from a low level to a high level. This may inactivate the first transistor 676 and activate the third transistor 678. A current may flow from the node 682 through the second transistor 677 and third transistor 678 to the ground voltage (e.g., VSS). The amount of current may be proportional to the voltage HammerFreq applied to the gate of the second transistor 677. The higher the voltage HammerFreq, the higher the current. The current may allow the capacitor 679 to discharge to ground, which may decrease the voltage on the node 682. Accordingly, the higher the voltage HammerFreq, the faster the voltage on the node 682 decreases. When the voltage on the node 682 falls below a threshold of the inverter 680, the inverter may switch to providing the signal High at a high level. The time between when the signal SampleVtoT is switched from a low level to a high level to when the signal High switches from a low level to a high level may be proportional to the voltage HammerFreq, with higher voltages leading to shorter times.

The two capacitors 674 and 679 may be adjustable in some embodiments. Adjusting the capacitor 674 may adjust the rate at which the voltage on the node 681 increases when the signal SampleVtoT is provided at a high level. Adjusting the capacitor 679 may adjust the rate at which the voltage on the node 682 decreases when the signal SampleVtoT is provided at a low level.

Figure 7:
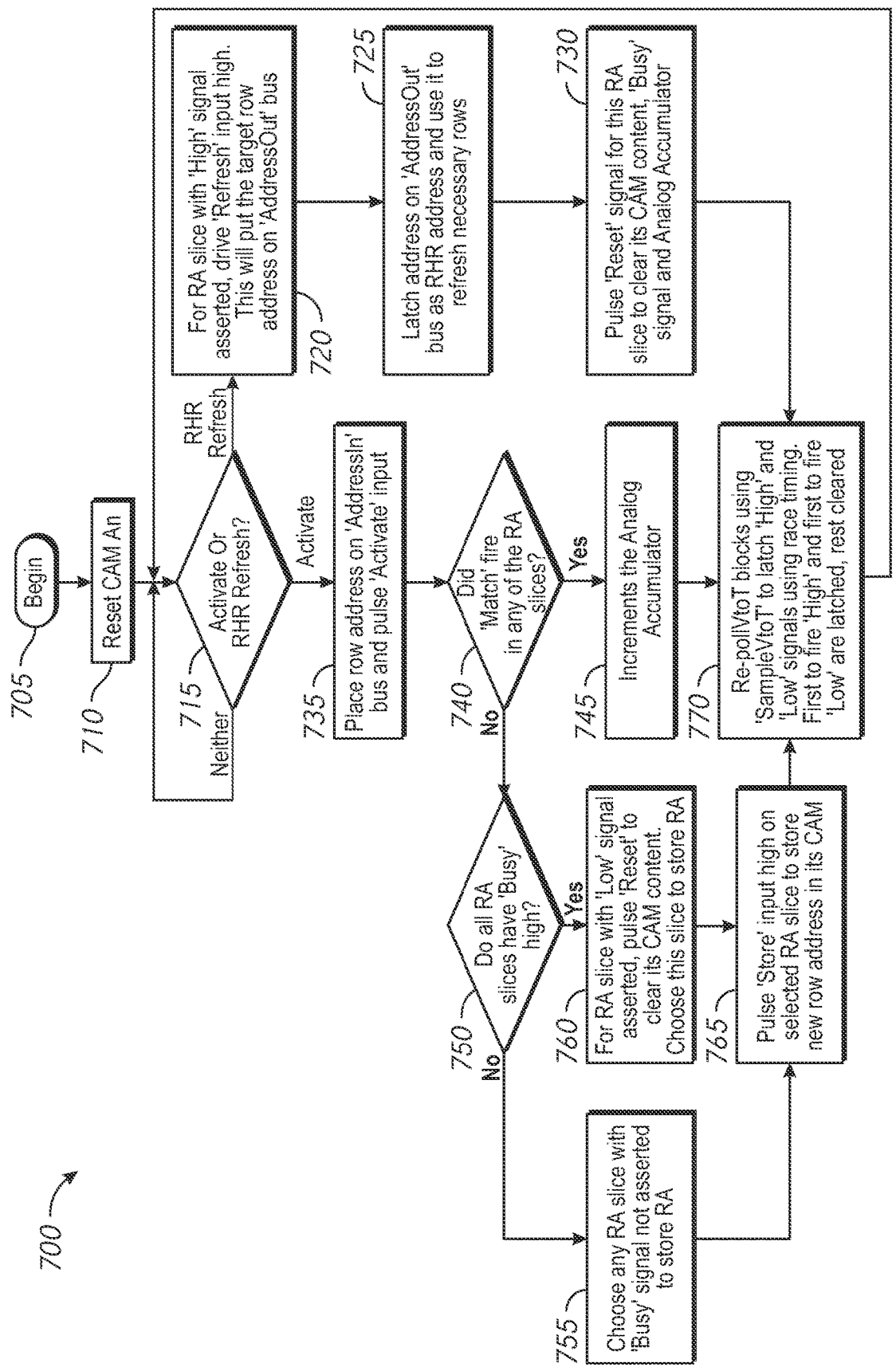
FIG. 7 is a flow chart of a method of analog row access rate determination according to an embodiment of the present disclosure.

FIG. 7 is a flow chart of a method of analog row access rate determination according to an embodiment of the present disclosure. The method 700 may be implemented by one or more of the circuits or devices described in FIGS. 1-6 in some embodiments. Although the method may be described using certain signals, different patterns of signals may be used in other embodiments which use circuits different from the ones described herein.

The method 700 may generally begin with block 705, which describes a beginning of the method. For example, the method 700 may begin when the device (e.g., device 100 of FIG. 1) powers on. Block 705 may generally be followed by block 710, which describes resetting the components of the stack (e.g., stack 300 of FIG. 3A). For example, a stack logic circuit (e.g., stack logic circuit 343 of FIG. 3A) may provide a signal Reset which may reset accumulator circuits (e.g., accumulator circuit 346 of FIG. 3B and/or 500 of FIG. 5) so that the voltage HammerFreq they provide is at an initial level (e.g., a ground voltage such as VSS). In some embodiments, the addresses stored in the slices (e.g., slice 341 of FIGS. 3A-3B) may be reset. For example, all of the CAM cells may be set to store a bit at a low level in some embodiments. In another example, CAM cells which store a busy signal may be reset such that all of the busy signals indicate that the files (e.g., files 342 of FIG. 3B) are not in use.

Block 710 may generally be followed by block 715 which describes determining if an access operation or a refresh operation is being performed. For example, the stack logic circuit may receive a row address (e.g., XADD) which indicates an access operation. In some embodiments, the stack logic circuit may receive additional signals such as ACT/Pre, which may be used instead of or in addition to the row address XADD to indicate that an access operation is occurring. In some embodiments, the row addresses may be ignored until a row address is received along with a sampling signal (e.g., ArmSample of FIG. 2). Responsive to receiving the row address XADD, the row address XADD may be provided to the stack as the input address AddressIn and the signal Activate is provided to compare the row address XADD to the contents of the stack as described in blocks 735-765.

If a targeted refresh operation is being performed, (e.g., the signal RHR is received from RHR state control circuit 236 of FIG. 2) it may indicate that the stack should provide an address as the match address HitXADD so that its victim wordlines can be refreshed, as generally described in boxes 720-730. If neither an access operation nor an RHR operation is being performed, block 715 may generally be repeated until one of those two conditions occurs (or until the method 700 is ended for some other reason, for example, powering off the device).

If a row address XADD is received (e.g., as part of an access operation), block 715 may generally be followed by block 735, which describes placing the row address on the AddressIn bus and pulsing the signal Activate. The received address XADD may be provided as the signal AddressIn to each of the files (e.g., files 342 of FIG. 3B) of the stack in common. The address XADD may be split up such that a first CAM cell in each of the files receives a first bit of the address XADD as the input AddressIn, a second CAM cell in each of the files receives a second bit of the address XADD as the input AddressIn and so forth. In some embodiments, the different bits of XADD may be supplied to the corresponding CAM cells in parallel. The signal Activate may be provided (e.g., as a pulse from a low level to a high level and back to a low level) to activate various components used in the slices of the stack. The signal Activate along with the input address AddressIn may cause the slices to compare the input address AddressIn to their respective stored addresses.

Block 735 may generally be followed by block 740, which describes determining if the signal Match fires (e.g., is provided at a high level) by any of the slices of the stack. Each bit of the received row address XADD may be compared to the corresponding CAM cell in each of the slices (e.g., in the file in each of the slices). The match signals from each individual CAM cell in a file may be coupled to an AND gate, which provides an overall signal Match which is at a high level only if each bit of XADD matches all of the bits stored in the CAM cells of the file. In block 740 the states of the signals Match from each of the files may be examined to determine if any are at a high level after the comparison operation described in block 735.

If any of the signals Match are at a high level, block 740 may generally be followed by block 745 which describes incrementing the analog accumulator. The accumulator circuits in each slice may receive the signal Match from the files in that slice. If the signal Match is at a high level, it may cause a preset amount of charge to be added to a capacitor (e.g., capacitor 565 of FIG. 5) in the accumulator circuit. This may increase a voltage HammerFreq provided by the accumulator circuit. The voltage HammerFreq may decrease over time (e.g., due to the 'leak' through the transistor 564 of FIG. 5). The amount that the voltage is increased when the accumulator is incremented, and the rate of the leak may be adjustable in some embodiments. The voltage HammerFreq may decrease while other steps of the method (e.g., as described in blocks 715-770) are occurring.

Block 745 may generally be followed by block 770, which describes polling the VtoT circuits (e.g., VtoT circuits 348 of FIG. 3B and/or 600 of FIG. 6). The stack control circuit may provide the signal SampleVtoT at a high level, which may trigger the high VtoT circuits (e.g., 602 of FIG. 6) in each of the slices to begin discharging and the low VtoT circuits (e.g., 601 of FIG. 6) in each of the slices to begin charging. The VtoT circuits may be activated using 'race timing', which may cause each VtoT circuit to provide the signals High and Low with speed based on the voltage HammerFreq received from that VtoT circuit's associated accumulator circuit. The higher the voltage HammerFreq, the faster the signal High switches to a high level after the signal SampleVtoT switches to a high level. The lower the voltage HammerFreq, the faster the signal Low switches to a high level after the signal SampleVtoT switches to a high level. The first slice to provide the signal High at a high level may be saved (e.g., in high latch 345 of FIG. 3A) and the first slice to provide the signal Low at a high level may be saved (e.g., in a low latch 347 of FIG. 3A). In some cases, the signals High and Low may be saved in respective high and low latches for each of the slices, however only the first high latch to save a high signal High and the first low latch to save a high signal Low may be saved while the rest may be cleared. The block 770 may generally be followed by block 715, restarting the process of waiting for activate or RHR commands.

Returning to block 740, if the signal Match was not provided by any slice, then block 740 may generally be followed by block 750. Block 750 describes determining if all of the slices are busy. Each slice may provide a signal Busy with a level which indicates if the slice is currently storing an unrefreshed row or not. In some embodiments, block 750 may involve checking to see if all of the Busy signals are at a high logical level or not.

If not all the slices are busy (e.g., if at least one Busy signal is at a low logical level) then block 750 may generally be followed by block 755. Block 755 describes choosing a slice which is not busy to store the row address (e.g., XADD) which was received as part of the activate command during block 715. In some embodiments, if more than one slice has the signal Busy at a low logical level, then one of the slices with Busy at a low logical level may be selected. For example, a slice with a lowest index may be chosen. Block 755 may generally be followed by block 765 as described herein.

If all the slices are busy, then block 750 may be followed by block 760, which describes storing the received row address in the slice with the Low signal at a high logic level. As described in block 770, the slice which has the lowest voltage HammerFreq (which is proportional to the rate at which the row address stored in that slice is accessed) has the signal Low saved at a high level in a low latch. During block 760, that slice may be reset (e.g., in a manner similar to block 710, except only for a specific slice), by providing the signal Reset at a high level to the slice with the signal Low at a high level. The signal Reset may cause the accumulator circuit to reset to a minimum value of HammerFreq (e.g., by discharging the capacitor to a ground voltage). Block 760 may generally be followed by block 765.

Blocks 755 and block 765 may generally be followed by block 765 which describes storing the received row address in the selected slice. The process described in block 765 may be the same whether the slice was selected by the process described in block 755 (e.g., the slice is not busy) or the process described in block 760 (e.g., the slice is associated with the signal Low). During the process described in the block 765 the each bit of the received address XADD may be provided as the external signal AddressIn to a corresponding CAM cell of the selected slice. In some embodiments the signals AddressIn may be provided in common to all of the slices. In some embodiments, the signals AddressIn may still be being provided as they were during block 735. The stack control logic may provide the write signal Store at an active level to the selected slice. This may cause the file in the selected slice to store the values of the bits of the received address XADD in the file, overwriting the previous stored row address (if any). If the signal Busy was not previously set to a high level, it may be set to a high level after the row address is stored. Block 765 may generally be followed by block 770, which proceeds as previously described.

Returning to block 715, if a refresh command (e.g., the signal RHR) is received, then block 715 may generally be followed by block 720. Block 720 describes providing the row address from the slice with the signal High at a high logical level. As described in block 770, the slices may be polled and the signal High may be saved at a high logical level for one of the slices. In block 720, the signal Refresh may be provided at a high level to the slice which has the signal High at a high level. This may cause the row address stored in the file of that slice to be provided on the AddressOut bus.

Block 720 may generally be described by block 725, which describes refreshing victim addresses associated with the address provided on AddressOut. The address provided on the AddressOut bus may be latched by the stack control circuit and provided as the match address HitXADD. A refresh address generator (e.g., 239 of FIG. 2) may generate one or more refresh addresses RXADD based on the value of the match address HitXADD. The refresh addresses RXADD may be refreshed in one or more targeted refresh operations.

Block 725 may generally be followed by block 730, which describes resetting the accumulator circuit associated with the row address that was provided as the match address HitXADD. The stack control circuit may provide the signal Reset to the slice associated with the signal High at a high logical level. The signal Reset may cause the accumulator circuit to reset the voltage HammerFreq to a minimum level (e.g., a ground voltage such as VSS). The signal Reset may also clear the contents of the file (e.g., by resetting the CAM cells and/or by changing the Busy signal to a low level). Block 730 may generally be followed with block 770 as previously described.

In some embodiments, determining the highest and lowest voltages (e.g., as described in block 770) may only be triggered when a slice which has the highest or lowest voltage needs to be identified, rather than being performed each time an RHR or access command is received as shown in the example embodiment of FIG. 7. For example, in one such on demand embodiment, block 770 may be performed between blocks 715 and 720 (e.g., block 770 may be performed responsive to receiving an RHR signal), and blocks 730, 745, and 765 may generally be followed by block 715. In such an embodiment, additional logic may also be used to indicate when the signal SampleVtoT should be provided in order to trigger the operation described in block 770. In another example, the signal SampleVtoT (e.g., the operation of block 770) may be provided after receiving an RHR signal, and may also be provided before the operation of block 760, in order to determine which slice should have its content replaced.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. A method comprising:
   receiving a row address;
   comparing the row address to a plurality of stored row addresses, each stored in a respective one of a plurality of files;
   changing a voltage provided by an accumulator circuit associated with one of the plurality of files responsive to the row address matching the stored address by adding an amount of charge to a capacitor of the accumulator circuit; and
   determining one of the plurality of files associated with a maximum voltage based on a signal from a voltage to time (VtoT) circuit associated with the accumulator circuit.

2. The method of claim 1, further comprising decreasing the voltage over time by leaking charge off the capacitor.

3. The method of claim 1, further comprising:
   receiving a refresh signal;
   providing the stored address from the one of the plurality of files associated with the maximum voltage; and
   resetting the maximum voltage to an initial voltage by discharging a capacitor of the accumulator circuit.

4. The method of claim 1, further comprising determining one of the plurality of files associated with a minimum voltage based on a signal from the VtoT circuit.

5. The method of claim 4, further comprising storing the row address in one of the plurality of files responsive to the row address not matching the stored address in any of the plurality of files, wherein the row address is stored in the one of the plurality of files associated with the minimum voltage responsive to all of the plurality of files being busy.

6. The method of claim 1, further comprising providing a match signal associated with one of the plurality of files at an active level responsive to the row address matching the stored row address in the associated one of the plurality of files, wherein the voltage is increased responsive to the match signal.

7. The method of claim 1, further comprising providing a command signal to the VtoT circuit and receiving the signal from the VtoT circuit following a period of time after providing the command signal, wherein the maximum voltage is determined based on the period of time.

8. An apparatus comprising:
   a plurality of files, each configured to store a row address and a voltage associated with the row address, and wherein the voltage is based on charge stored on a capacitor;
   a plurality of voltage to time (VtoT) circuits each associated with one of the plurality of files, the plurality of VtoT circuits configured to receive a command signal and provide a first signal following a first time after receiving the command signal, wherein the first time is based in part on the stored voltage in the associated one of the plurality of files; and
   a stack logic circuit configured to determine a maximum voltage in the plurality of files based on the first signals from the plurality of VtoT circuits.

9. The apparatus of claim 8, wherein each of the plurality of files comprises a plurality of content addressable memory (CAM) cells.

10. The apparatus of claim 8, further comprising a plurality of accumulator circuits each associated with one of the plurality of files, each of the plurality of accumulator circuit configured to provide the voltage associated with the row address.

11. The apparatus of claim 10, wherein each of the plurality of accumulator circuits includes the capacitor.

12. The apparatus of claim 8, wherein the voltage is proportional to a number of times that a received row address matches the associated stored row address.

13. The apparatus of claim 8, wherein the stack logic circuit is further configured to receive a row address, determine if the received row address is stored in one of the plurality of files and store the received row address in one of the plurality of files if the received row address is not stored in one of the plurality of files.

14. The apparatus of claim 13, wherein each of the plurality of files is configured to provide a busy signal indicating if the row is busy or not, and wherein the stack logic circuit is configured to write the received row address to one of the plurality of files associated with a lowest voltage if all of the plurality of files are busy and to write the receive row address to one of the plurality of files which is not busy otherwise.

15. An apparatus comprising:
   a file configured to store a row address and compare a received row address to the stored row address;
   an accumulator circuit configured to provide an accumulator voltage which is proportional to a rate at which the received row address matches the stored row address, wherein the accumulator circuit includes a capacitor and the accumulator voltage is based on a charge on the capacitor; and a voltage to time (VtoT) circuit configured to receive a command signal and provide a first signal following a first time after receiving the command signal, wherein a length of the first time is proportional to the accumulator voltage.

16. The apparatus of claim 15, wherein a charge of the capacitor is increased responsive to a match between the received row address and the stored row address, wherein the charge decreases over time due to a leak current, and wherein the accumulator voltage is proportional to the charge.

17. The apparatus of claim 15, further comprising:
a refresh address generator configured to provide a refresh address based on a hit address; and
a stack logic circuit configured to provide the stored address as the hit address responsive to a refresh signal based, in part, on the length of the first time.

18. The apparatus of claim 15, further comprising a sample timing generator configured to provide activations of a sample signal, wherein the row address is received responsive to the activation of the sample signal.

19. The apparatus of claim 15, wherein the VtoT circuit is further configured to provide a second signal following a second time after receiving the command signal, wherein a length of the second time is proportional to the accumulator voltage.

20. The apparatus of claim 19, further comprising a stack logic circuit configured to store the received row address in the file based, in part, on the length of the second time.

\* \* \* \* \*